(12) United States Patent
Barry et al.

(10) Patent No.: US 10,928,320 B2
(45) Date of Patent: Feb. 23, 2021

(54) INTEGRATED MOUNTING SOLUTION FOR SOLID-STATE SPIN SENSORS USED FOR BULK DETECTION AND IMAGING

(71) Applicant: President and Fellows of Harvard College, Cambridge, MA (US)

(72) Inventors: John Francis Barry, Cambridge, MA (US); Jennifer May Schloss, Cambridge, MA (US); Matthew James Turner, Somerville, MA (US); Ronald Lee Walsworth, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 221 days.

(21) Appl. No.: 16/008,789

(22) Filed: Jun. 14, 2018

(65) Prior Publication Data
US 2018/0364165 A1  Dec. 20, 2018

Related U.S. Application Data

(60) Provisional application No. 62/519,267, filed on Jun. 14, 2017.

(51) Int. Cl.
| | |
|---|---|
| *G01N 21/64* | (2006.01) |
| *G01N 22/00* | (2006.01) |
| *G01R 33/00* | (2006.01) |
| *G01R 33/12* | (2006.01) |

(52) U.S. Cl.
CPC ......... *G01N 21/64* (2013.01); *G01N 21/6489* (2013.01); *G01N 22/00* (2013.01); *G01R 33/00* (2013.01); *G01R 33/1284* (2013.01)

(58) Field of Classification Search
CPC .... G01N 21/64; G01N 21/6489; G01N 22/00; G01R 33/00; G01R 33/1284
See application file for complete search history.

(56) References Cited

U.S. PATENT DOCUMENTS

| | | | |
|---|---|---|---|
| 6,980,283 B1 * | 12/2005 | Aggarwal | G01N 21/87 356/30 |
| 9,720,055 B1 | 8/2017 | Hahn et al. | |
| 2015/0253355 A1 * | 9/2015 | Grinolds | G01R 33/022 850/40 |

(Continued)

OTHER PUBLICATIONS

Aspenberg et al., "Benign response to particles of diamond and SiC: bone chamber studies of new joint replacement coating materials in rabbits," Biomaterials, Apr. 1996, vol. 17, Issue 8, p. 807-812.

(Continued)

*Primary Examiner* — Georgia Y Epps
*Assistant Examiner* — Don J Williams
(74) *Attorney, Agent, or Firm* — Wilmer Cutler Pickering Hale and Dorr LLP

(57) ABSTRACT

Solid-state spin sensor systems and methods of manufacturing are disclosed. A mounting structure may be provided in thermal contact with a solid-state spin sensor having a plurality of color center defects such that thermal energy flows from the solid-state spin sensor to the mounting structure. A microwave application structure may be disposed on a face of the mounting structure or a face of the solid-state spin sensor for applying microwave radiation to the solid-state spin sensor.

20 Claims, 18 Drawing Sheets

(56) References Cited

U.S. PATENT DOCUMENTS

2017/0023487 A1    1/2017  Boesch

OTHER PUBLICATIONS

Barry et al., "Optical magnetic detection of single-neuron action potentials using quantum defects in diamond," Proceedings of the National Academy of Sciences, Dec. 6, 2016, vol. 113, No. 49, pp. 14133-14138; E6730.
Coletti et al., "Biocompatibility and wettability of crystalline SiC and Si surfaces," Proc. 29th Annu. Int. Conf. IEEE Eng. Med. Biol. Soc., Aug. 2007, pp. 5849-5852.
Le Sage et al., "Efficient photon detection from color centers in a diamond optical waveguide," Physical Review B, Mar. 23, 2012, vol. 85, 4 pages.
Le Sage et al., "Optical magnetic imaging of living cells," Nature, Apr. 25, 2013, vol. 496, pp. 486-489.
Pham et al., "Magnetic field imaging with nitrogen-vacancy ensembles," New Journal of Physics, Apr. 28, 2011, vol. 13, 14 pages.
Santavirta et al., "Biocompatibility of silicon carbide in colony formation test in vitro," Archives of Orthopedic and Trauma Surgery, Feb. 1998, vol. 118, pp. 89-91.
Schloss et al., "Simultaneous Broadband Vector Magnetometry Using Solid-State Spins," Physical Review Applied, Sep. 21, 2018, vol. 10, Issue 3, 13 pages.
Wolf et al., "Subpicotesla Diamond Magnetometry," Physical Review X, Oct. 5, 2015, vol. 5, Issue 4, 10 pages.
Yakimova et al., "Surface functionalization and biomedical applications based on SiC," Journal of Physics D: Applied Physics, Oct. 5, 2007, vol. 40, 6435-6442.

\* cited by examiner

INTEGRATED MOUNTING SOLUTION FOR SOLID-STATE SPIN SENSORS USED FOR BULK DETECTION AND IMAGING

CROSS-REFERENCE TO RELATED APPLICATIONS

This application claims the benefit of priority to U.S. Provisional Application No. 62/519,267, entitled "INTEGRATED MOUNTING SOLUTION FOR SOLID STATE SPIN SENSORS USED FOR BULK DETECTION AND IMAGING," filed on Jun. 14, 2017, the disclosure of which is hereby incorporated by reference in its entirety.

STATEMENT OF GOVERNMENT INTEREST

The present invention was made with United States government support under Grant No. HR0011-11-C-0073, awarded by the Defense Advanced Research Projects Agency (DARPA), and under Grant No. W911NF-15-1-0548, awarded by the Army Research Office (ARO).

BACKGROUND

Current generation sensors based on solid-state spin systems offer a high-performance, low-cost, low-power platform for sensing or imaging of magnetic fields, electric fields, temperature, pressure and other physical quantities, sometimes with resolution down to the nanoscale. These sensors employ color center defects, which are located within the solid-state spin sensor crystal, to measure physical quantities. In some implementations, the value of the physical quantity to be measured is determined by the energy levels of the quantum spin states of the color center defects. In other implementations, the value of the physical quantity to be measured is determined by the distribution of the color center defects between the different quantum spin states. In some implementations, the microwave and optical excitation radiation are applied to the solid-state spin sensor so that the physical quantity to be measured influences either the quantum energy levels or the distribution of the color center defects between the different quantum energy levels. Thus, by measuring either the quantum energy levels or the population distribution of the color centers defects between the different quantum energy levels, the value of the physical quantity can be determined (i.e., measured). The optical excitation radiation and the microwave radiation both typically deposit heat into the solid-state spin sensor. Since temperature drift can mimic spurious signals of the physical quantity to be measured, and since excessive temperatures may prohibit contact with biological specimens, it is best to remove this deposited heat as efficiently as possible. However, since use of an electrically conductive material (e.g., metal) as a heat sink or heat spreader can interfere with effective delivery of the microwave radiation, electrically insulating materials are preferred as heat sinks or heat spreaders for the sensor crystal. Use of an electrically conductive material may also influence biological activity such as electrical return currents in neurons or may be toxic to certain biological samples, and is sometimes undesirable. Finally, to avoid excessive measurement noise associated with vibration of the solid-state spin sensor, it is desirable that the mounting configuration be robust, sturdy, and stiff.

SUMMARY

An integrated mounting solution for the sensor crystal that simultaneously offers high thermal conductance, convenient microwave radiation delivery and good mechanical stiffness that includes, for example, a semi-insulating silicon carbide is described.

In one or more embodiments, a solid-state spin sensor system, comprises: a solid-state spin sensor having a plurality of color center defects; a mounting structure, wherein the mounting structure is in thermal contact with the solid-state spin sensor such that thermal energy flows from the solid-state spin sensor to the mounting structure; and a microwave application structure, disposed on a face of the mounting structure or a face of the solid-state spin sensor for applying microwave radiation to the solid-state spin sensor.

In one or more embodiments, the mounting structure is positioned and arranged to mechanically support the solid-state spin sensor.

In one or more embodiments, the mounting structure is a thin layer having a thickness between 50 micrometers to 2 centimeters.

In one or more embodiments, the microwave application structure is disposed on the face of the mounting structure that is proximal to the solid-state spin sensor.

In one or more embodiments, a first side of the microwave application structure is fixed to a face of the mounting structure, and the solid-state spin sensor is fixed to a second side of the microwave application structure opposite the first side of the microwave application structure, the solid-state spin sensor system further comprises: a light collection element configured to collect light emitted from the color center defects in the solid-state spin sensor traveling in a direction moving away from the second side of the microwave application structure.

In one or more embodiments, the mounting structure further comprises a hole, and wherein the microwave application structure and the solid-state spin sensor are disposed such that they cover at least a part of the hole.

In one or more embodiments, the microwave application structure has a thickness of 10 nanometers to 20 micrometers.

In one or more embodiments, the mounting structure and the microwave application structure are on opposing sides of the solid-state spin sensor.

In one or more embodiments, the solid-state spin sensor system further comprises a glass coupling element for delivery of light to the solid-state spin sensor.

In one or more embodiments, the solid-state spin sensor system further comprises: immersion oil contacting an emission face of the solid-state spin sensor; and an imaging element contacting the immersion oil opposite the emission face of the solid-state spin sensor, wherein the imaging element is configured to collect light emitted by the color center defects in the solid-state spin sensor.

In one or more embodiments, the microwave application structure or portions thereof are reflective to decrease the quantity of light exits one side of the solid-state spin sensor and increases the quantity of light which exits another side of the solid-state spins sensor.

In one or more embodiments, the mounting structure is secured to the solid-state sensor using a high thermal conductive bond.

In one or more embodiments, he solid-state spin sensor system further comprises a spatially resolved imaging device configured to capture at least one image of light emitted by the solid-state spin sensor, wherein the image provides spatially resolved information about a physical quantity.

In one or more embodiments, the solid-state spin sensor comprises color center defects located in a layer on one surface of the solid-state spin sensor.

In one or more embodiments, the solid-state spin sensor system is configured for use as a bulk detector.

In one or more embodiments, the solid-state spin sensor comprises color center defects located throughout approximately the entire thickness of the spin sensor.

In one or more embodiments, the mounting structure comprises at least one of diamond, semi-insulating silicon carbide, zinc oxide, silicon, gallium nitride, magnesium oxide, magnesium fluoride, and sapphire.

In one or more embodiments, a method of manufacturing a solid-state spin sensor system comprises: providing a solid-state spin sensor having a plurality of color center defects; providing a mounting structure in thermal contact with the solid-state spin sensor; and disposing a microwave application structure on a face of the mounting structure or a face of the solid-state spin sensor for applying microwave radiation to the solid-state spin sensor.

In one or more embodiments, said disposing the microwave application structure on a face of the mounting structure or a face of the solid-state spin sensor comprises printing the microwave application structure on the face of the mounting structure or the face of the solid-state spin sensor.

In one or more embodiments, the microwave application structure is disposed on a face of the mounting structure that is proximal to the solid-state spin sensor.

In one or more embodiments, the mounting structure and the microwave application structure are on opposing sides of the solid-state spin sensor.

BRIEF DESCRIPTION OF THE DRAWING

The invention is described with reference to the following figures, which are presented for the purpose of illustration only and are not intended to be limiting of the invention.

DETAILED DESCRIPTION

Figure 1:
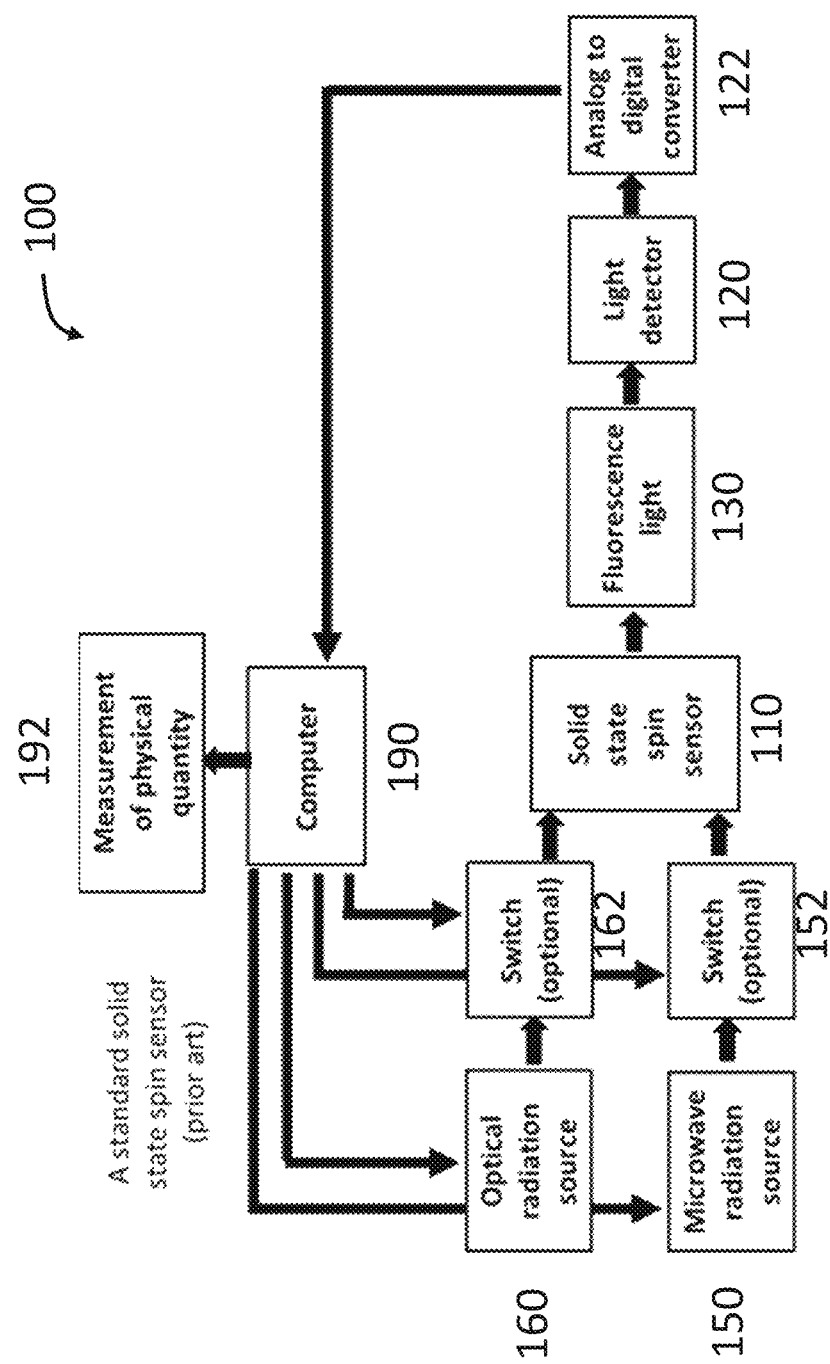
FIG. 1 is a schematic illustration of a standard solid-state spin sensor system.

According to some embodiments, a fully integrated solution for mounting a solid-state spin sensor based on the combined use of a mounting structure, metalized layers for applying microwave radiation to the solid-state spin sensor, and light couplers is used to efficiently deliver the optical excitation radiation to the solid-state spin sensor. According to some embodiments, semi-insulating silicon carbide is used as the mounting structure, which acts as a high-thermal-conductivity heat spreader with good mechanical stiffness and does not directly interfere with microwave radiation delivery to the solid-state spin sensor. At present, silicon carbide has the highest thermal conductivity of any easily commercially available bulk material that is not diamond (which could also be used). Also, semi-insulating silicon carbide has sufficient electrical resistivity (typically $>10^5$ ohm*cm or beneficially $>10^9$ or $10^{11}$ ohm*cm) so that employing semi-insulating silicon carbide material as a heat sink (or heat sink/heat spreader combination) will not hinder microwave radiation delivery, unlike copper and other metals typically used as heat sinks or heat spreaders. According to some embodiments, semi-insulating silicon carbide is un-doped or doped with Vanadium. By contrast, conductive silicon carbide, which is typically doped with nitrogen, has an electrical resistivity of approximately 0.03 ohm*cm. Semi-insulating silicon carbide is also very stiff, which aids in constructing a more durable sensor with reduced susceptibility to vibration or shock. Semi-insulating silicon carbide is also typically clear, whereas conductive silicon carbide is typically green and opaque, which might interfere with light collection. However, use of other materials is contemplated as is described below.

Solid-state spin sensors are an emerging sensing technology that employ color center defects in a solid-state material to measure one or more physical quantities. For example, sensors based on nitrogen-vacancy (NV) color center defects in diamond are one example of a solid-state spin sensor. Solid-state spin sensors may be used to measure physical quantities such as magnetic field, electric field, temperature, pressure, pH or the presence of an atomic, molecular, or other hadronic species.

Solid-state spin sensors typically operate as described herein. The one or more color center defects within the solid-state spin sensor are illuminated via an optical radiation source, which generates the optical excitation radiation. Illumination with the optical excitation radiation causes the color center defects to emit a fluorescence light, which is collected by a light detector. The application of the optical excitation radiation to the one or more color center defects may be accompanied by application of microwave radiation to the one or more color center defects. The optical excitation radiation and the microwave radiation may be applied simultaneously or sequentially or a combination of simultaneously and sequentially. In some implementations, the microwave radiation is used to manipulate the population distribution between the quantum energy levels of the one or more color center defects. The application of the optical and microwave radiation is arranged so that information pertaining to the physical quantity to be measured is encoded in emitted fluorescence light. For example, if a diamond containing nitrogen-vacancy color center defects is illuminated with green light (495-570 nm) and appropriate microwave radiation, the diamond may emit red fluorescence light (630-850 nm) in proportion to a magnetic field (e.g., the physical quantity being measured).

FIG. 1 is a schematic illustration of a standard solid-state spin sensor system 100. As shown in FIG. 1, the solid-state spin sensor system 100 includes a solid-state spin sensor 110, at least one light detector 120, an analog to digital converter (ADC) 122, a computer 190, optical and microwave radiation sources 160 and 150, and optional switches 162 and 152. As shown in FIG. 1, computer 190 controls the radiation sources 160 and 150 to selectively apply optical and microwave via switches 162 and 152 to the solid-state spin sensor 110. Both microwave radiation and optical excitation radiation are applied to the solid-state spin sensor. For example, optical radiation may be applied to initialize and readout the solid-state spins sensor 110, while microwave radiation may be applied to the solid-state spin sensor in order to manipulate the quantum state of individual spins (as discussed below) in the solid-state spin sensor 110. The computer 190 may control aspects of the microwave radiation and the optical excitation radiation, such as the power and spectral content. When excited by the optical excitation radiation, the color center defects in the solid-state spin sensor 110 emit fluorescence light, which is collected by light detector 120. Light detector 120 may be any conventional light detector, such as but not limited to a non-spatially resolved photodiode or a spatially resolved microscope imaging system/camera. Light detector 120 may optionally provide an analog signal (e.g., one indicative of the amount of fluorescence light impinging on the light detector) to analog-to-digital converter (ADC) 122 for digitization. This digital signal may then be provided to computer 190 for analysis. Computer 190 may analyze the digital signal. Given the known temporal and spectral properties of the applied microwave radiation and optical excitation radiation, along with the detected optical fluorescence light, the computer can calculate the value of the physical quantity to be measured 192. The measurement of a physical quantity 192 sensed by the solid-state spin sensor 110 can be output by the computer or stored for some other use. This measurement may be, for example, but is not limited to, the value of a magnetic field across the solid-state spin sensor 110 or a spatially resolved image of the magnetic field proximate to the solid-state spin sensor 110.

Figure 2:
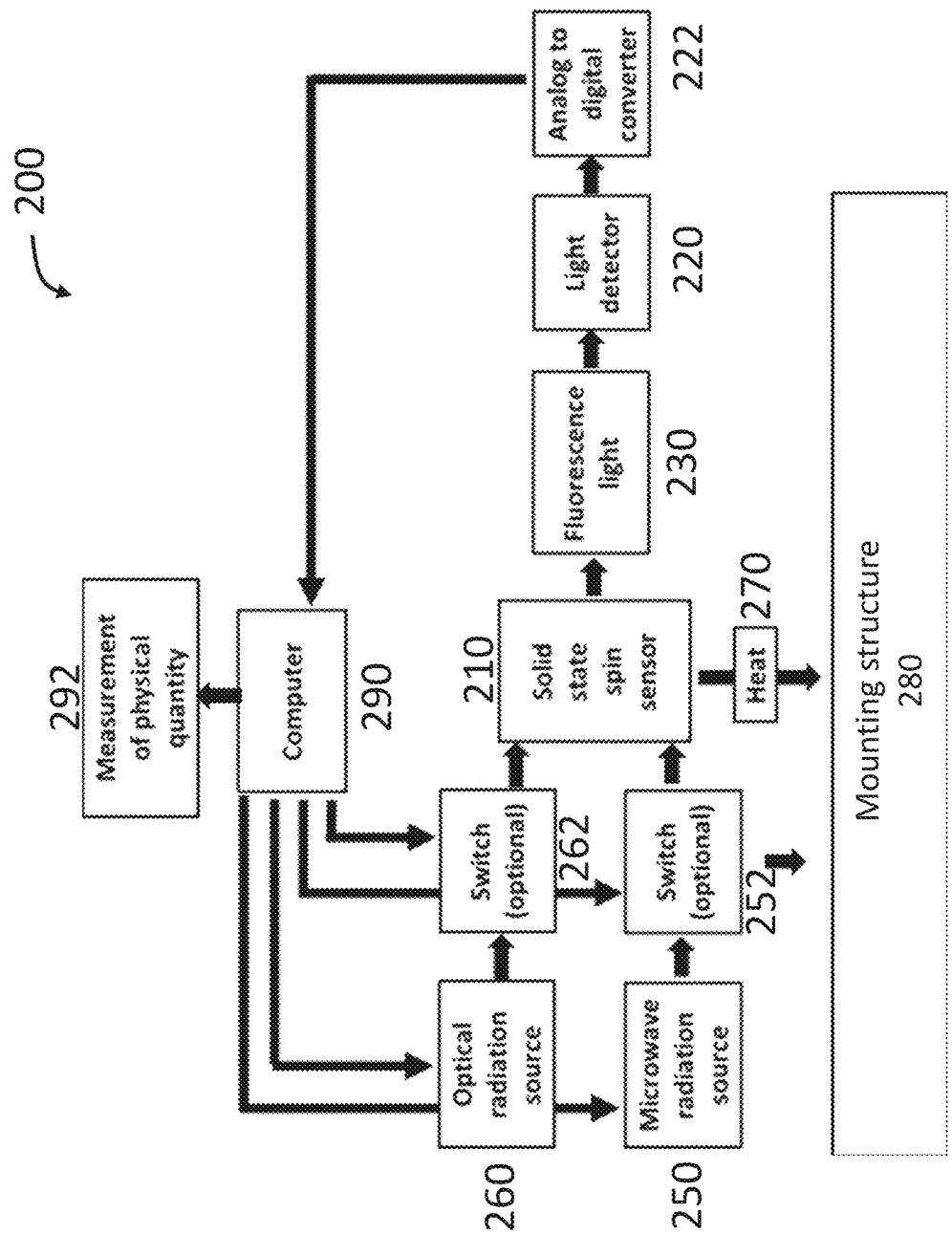
FIG. 2 is a schematic illustration of a solid-state spin sensor system embodying one or more aspects of the invention.

FIG. 2 is a schematic illustration of a solid-state spin sensor system 200 embodying one or more embodiments. As shown in FIG. 2, the solid-state spin sensor system 200 includes a solid-state spin sensor 210, at least one light detector 220, an analog to digital converter (ADC) 222, a computer 290, optical and microwave radiation sources 260 and 250 (such as signal generators), and optional switches 262 and 252. These elements operate similar to like-named elements described with reference to FIG. 1 in order to detect fluorescence light 230 and output measurement of physical quantity 292. However, as shown in FIG. 2, the solid-state spin sensor system 200 further includes a heat sink 280. Heat sink 280 may be affixed or held in close proximity to solid-state spins sensor 210 as described in more detail. Heat sink 280 may act as one or more of a heat sink to absorb heat collected on solid-state spins sensor 210 and provide mechanical support for the solid-state spin sensor 210 and other components such as a microwave application structure integrated on or near the solid-state spin sensors 210, an optical application structure for optical radiation source, and/or light collection optics for fluorescence light 230 as described in more detail below.

Included below are descriptions of various components, methods, and aspects of the systems 100 and/or 200. These are merely exemplary. Many of these elements are exemplified and described in greater detail in the embodiments of FIGS. 4-15.

Solid-State Spin Sensor:

This can refer to the crystal that houses the color center defects, such as solid-state spin sensors 110 or 210 in FIG. 1 or 2, respectively. One example of a crystal housing such color center defects would be diamond. Other examples include but are not limited to defects in sapphire, silicon carbide, and silicon. According to some embodiments silicon may be doped in order to increase the resistivity, thereby reducing interference with microwave application.

Color Center Defect:

These can include point-like defects inside the solid-state crystal that are responsive to some physical quantity or quality to be measured. These are housed within the solid-state spin sensors, such as 110 or 210. Their quantum spin states can be manipulated by optical excitation radiation and microwave radiation. Their quantum spin states can be made to be sensitive to certain physical parameters, based on control of various operational parameters as is known in the art. Typically, the detected optical fluorescence light depends on their quantum spin state. One example of such a defect is the nitrogen vacancy (NV) color center defect in diamond. Other examples include but are not limited to silicon vacancy in diamond, divacancy in silicon carbide, and titanium/chromium defects in sapphire.

Optical Excitation Radiation:

The optical excitation radiation, such as that from optical radiation sources 160, 260, can manipulate the quantum states of the color center defects in order to make a measurement of the physical quantity to be measured.

Microwave Radiation:

The microwave radiation, such as that from microwave radiation sources 150, 250, can manipulate the quantum spin states of the color center defects in order to make a measurement of the physical quantity to be measured.

Physical Quantity to be Measured 192 or 292:

This is the quantity (or quantities) that the solid-state spin sensor system 100, 200 is intended to measure: pressure, temperature, magnetic field, electric field, presence of a protein, presence of biological species, and/or microwave field distribution, intensity, or frequency.

Emitted Optical Fluorescence Light 130 or 230:

This includes the light emitted by the color center defects in the solid-state spin sensors 110 or 210. The value of the physical quantity to be measured can be inferred from the quantity of the detected optical fluorescence light. The amount of detected optical fluorescence light typically depends in part on the color center defect's quantum state, which in turn depends on the value of the physical quantity to be measured.

Detected Optical Fluorescence Light:

Some or all of the emitted optical fluorescence light can be collected and directed to the detectors 120, 220. For example, some of the emitted optical fluorescence light may intentionally not be collected and/or some may be lost through the various optical elements of the system. The quantity of the emitted optical fluorescence light that reaches the detector and is detected can be termed the detected optical fluorescence light.

Temporal Amplitude Fluctuations:

This describes a quantity that may not be constant in time, and the term typically applies to the detected optical fluorescence light. If these fluctuations are not related to fluctuations in the physical quantity to be measured, these fluctuations may be due to some undesirable noise source in the system. According to some embodiments, these amplitude fluctuations may be indicative of a changing quantity to be measured, such as an alternating magnetic field.

Color Center Defect Sensing Surface:

For imaging applications, the color center defects are typically arranged in a layer that can be approximated as a surface (see, for example, the discussion of FIG. 4A below). Thin layers of color center defects allow for spatial resolution of the resulting fluorescence light. Thicker layers may blur the signal and may be better suited for bulk applications that measure a quantity across the entire solid-state spin sensor 110 or 210.

Microwave Application Structure:

This component placed in proximity to the solid-state spin sensor can be used to apply or deliver the microwave radiation to the solid-state spin sensor. The microwave application structure can be a physical component fabricated typically on or in close proximity to the solid-state spin sensor, as described in more detail below.

Conventional spin sensors used for both bulk detection (e.g., use of spin sensors to measure a property across all color center defects, rather than spatially resolved measurement) and for microscope-style imaging of physical quantities (e.g., spatially resolved imaging using a spin sensor with many color centers sensitive to local properties) face several challenges. Primary problems are difficulty removing heat effectively from the solid-state spin sensor, difficulty delivering optical excitation radiation to the solid-state spin sensor without unnecessarily increasing amplitude noise of the emitted optical fluorescence light, and difficulty with effective delivery of microwave radiation to the solid-state spin sensor. In one aspect, the addition of a mounting structure to the solid-state spin sensor, as illustrated in FIG. 2, allows for a cost-effective and efficient solution to all these problems simultaneously.

Mounting Structures

In one aspect, the solid-state spin sensor (e.g., the diamond crystal for solid-state spin sensors based on nitrogen vacancy color center defects in diamond) is secured, e.g., adhered, to a mounting structure that constitutes a large thermal mass, such as, for example, more than 100 times the volume of the solid-state spin sensor, such as a large heat sink, or to a heat spreader connected to large heat sink. According to some embodiments the mounting structure may be 50 micrometers to 2 centimeters thick. In one or more embodiments, the thermal mass is a semi-insulating silicon carbide mass.

In one aspect, sensitivity of the solid-state spin sensor is improved by reducing unwanted amplitude variations (i.e., noise) in the emitted optical fluorescence light which can mimic a spurious signal. This can be accomplished by mounting or securing the solid-state spin sensor on a stiff or rigid mounting structure.

In some instances, large electric fields, voltages, or currents created by the microwave radiation can inductively or capacitively couple to nearby metals. This unwanted effect can be avoided by using materials for a mounting structure (e.g., a heat shield or heat sink) that are not electrically conductive. In certain embodiments, the mounting structure has one or more of the following properties: (a) high thermal conductivity, (b) electrically insulating, (c) optical transparency in the visible wavelength regime and in the near infrared wavelength regime, (d) chemically inert and biocompatible, (e) low cost, and (f) ability to easily add additional components, such as a light coupler or a reflective layer. According to some embodiments, the mounting structure may be constructed using a material having a thermal conductivity of greater than 10 W/(m*K) or greater than 100 W/(m*K). According to some embodiments, the mounting structure may have an electrical resistivity of greater than $10^7$ ohm*cm, or greater than $10^9$ ohm*cm.

Figure 3:
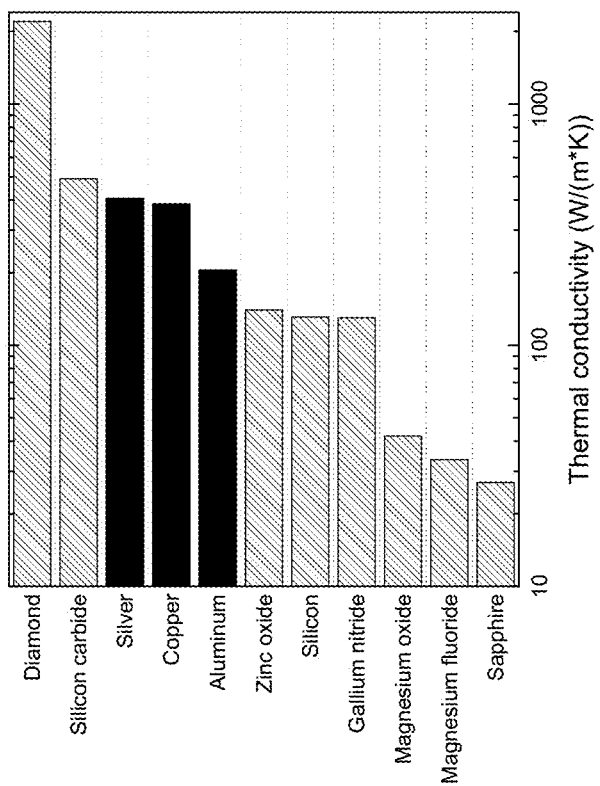
FIG. 3 is a table listing the thermal conductivity values for various materials.

Some exemplary materials that are suitable as mounting structures include any of the materials found in FIG. 3, such as, but not limited to diamond, semi-insulating silicon carbide, zinc oxide, silicon, gallium nitride, magnesium oxide, magnesium fluoride, or sapphire. According to some embodiments, the mounting structure is made up of multiple types of materials connected together, and may also include metals like silver, copper, or aluminum.

An exemplary material to be used as a mounting structure includes semi-insulating silicon carbide. Semi-insulating silicon carbide has a high Young's modulus of roughly 450 GPa. Thus, according to some embodiments, semi-insulating silicon carbide can also create a stable mounting structure for the solid-state spin sensor. Semi-insulating silicon carbide is transparent to light and therefore exhibits often minimal interference with the light irradiation or light emission of the system. Furthermore, as described in relation to FIG. 3, semi-insulating silicon carbide has high thermal conductivity but is not electrically conductive. Thus, using a material like semi-insulating silicon carbide for a mounting structure reduces the effects of heat and vibrations without interfering with optical measurement or the microwave application structure described in more detail below. Use of semi-insulating silicon carbide for the mounting structure (e.g., heat sink or heat spreader/heat sink combination) allows the heat removal problem and the microwave delivery problems to be solved largely independently. According to some embodiments, the mounting structure is a heat sink that dissipates heat on its own. According to some embodiments, the mounting structure is a heat spreader that transfers heat to another structure for dissipation.

According to some embodiments, the disclosed mounting structure (e.g., heat sink) offers one or more of the following advantages. Though the advantages are described based on a semi-insulating silicon carbide mounting structure, other materials are contemplated and would have similar effects to a different degree.

High thermal conductivity may be beneficial to allow the solid-state spin sensor (e.g., diamond) to maintain a constant temperature. Since temperature fluctuations of the solid-state spin sensor (e.g., diamond) can in some embodiments mimic a spurious signal of the physical quantity to be measured (such as magnetic field, electric field, pressure, etc.,) minimizing temperature fluctuations of the solid-state spin sensor (e.g., diamond) is highly desirable.

The presence of conductors around or near the microwave delivery system can cause unwanted parasitic microwave resonances and can degrade overall performance of the microwave delivery system. Thus, the mounting structure preferably has low interference with the microwave source design of the solid-state spin sensor device.

The mounting structure may be optically transparent in the visible wavelength regime and in the near infrared wavelength regime. This can in some circumstances facilitate optical excitation radiation delivery through or emitted optical fluorescence light collection through the mounting structure.

The mounting structure may be chemically inert and biocompatible. Neurons and other biological specimens can be exposed to the mounting structure for extended periods of time with no deleterious effects.

The mounting structure is preferably readily available in large wafers with lowered cost, particularly as production quantities increase.

The mounting structure may employ a reflective layer as discussed in more detail below, which increases the amount of detected optical fluorescence light, and therefore enhanced device sensitivity.

The mounting structure may employ a light coupler as discussed in more detail below to prevent burning of immersion oil.

Semi-insulating silicon carbide may, in particular, exhibit all of these properties discussed above.

Thermal Properties

The physical quantity to be measured by the solid-state spin sensor may be determined in some implementations by the energy levels of (or population distribution between) the quantum spin states of the color center defects. A common challenge for solid-state spin sensors is that changes in the solid-state spin sensor's temperature can change the energy levels of the quantum spin states of the color center defects, and therefore temperature changes can mimic changes in the physical parameter to be measured. Therefore, it is desirable to keep the solid-state spin sensor at constant temperature so that changes in the quantum energy levels can be attributed to changes in the physical quantity to be measured, rather than to spurious changes in the solid-state spin sensor's temperature. Additionally, effective temperature control of the solid-state spin sensor may be necessary for solid-state spin sensors near or in direct contact with biological or other samples, which are required to maintain a given temperature for viability.

Because shot noise in the detected optical fluorescence light is often the limiting factor in the performance of a well-designed and optimized solid-state spin sensor, the optimal amount of optical excitation radiation often consists of a large number of photons. For some devices, the optical excitation radiation applied to the solid-state spin sensor can consist of as many as $10^{20}$ photons per second. If most of these photons are optically absorbed by the solid-state spin sensor, the associated heat load can be as high as several watts. Similar considerations exist for the microwave radiation applied to the solid-state spin sensor, which can also apply a heat load as high as several watts to the solid-state spin sensor.

Large heat loads themselves are not necessarily problematic for device sensitivity; e.g., a large heat load that is exactly constant in time will result in the solid-state spin sensor's temperature residing at an equilibrium temperature above ambient temperature. Similarly, slow changes in the heat load experienced by the solid-state spin sensor are not difficult to accommodate as well; in this situation, the solid-state spin sensor's temperature changes in a slow and predictable manner. Such slow and predictable changes in temperature are easy to account for and eliminate in digital post-processing. Problems arise, however, when a large heat load exhibits fluctuations that cannot easily be removed by digital post-processing. In practice, such heat load fluctuations are often problematic for physical devices. Such heat load fluctuations might be caused by uncontrolled or unwanted changes in the intensity (amplitude) of the optical excitation radiation. Similarly, uncontrolled or unwanted changes in the intensity (amplitude) of the microwave radiation applied to the solid-state spin sensor can also create a large heat load that exhibits temporal amplitude fluctuations.

In the presence of a large heat load that exhibits temporal amplitude fluctuations, temperature fluctuations of the solid-state spin sensor can be effectively mitigated (i.e., attenuated) by adhering the solid-state spin sensor (e.g., the diamond crystal for solid-state spin sensors based on color center defects, such as nitrogen vacancy defects in diamond) to a large thermal mass, such as a large heat sink, or to a heat spreader connected to large heat sink. If the thermal conductance between the solid-state spin sensor and the heat sink or heat spreader/heat sink combination is very high, this configuration will effectively attenuate temperature changes of the solid-state spin sensor, since the applied thermal load must now act on a far larger thermal mass. A rough analogy is the heating of bodies of water by the sun, where the sun exerts a fluctuating heat load over a 24-hour period (due to the sun rising and setting every day). The temperature in shallow puddles will closely follow the day/night cycle of the sun, heating up substantially during the day and cooling off at night, since the puddle has low thermal mass. In contrast, a large body of water, such as an ocean or a deep lake will show much smaller variations associated with the sun's daily cycle, since the large thermal mass of large bodies of water make them much less susceptible to temporal fluctuations of the sun's applied heat load.

Light Delivery

Solid-state spin sensors typically encode information on the physical quantity to be measured in the amplitude modulation of the emitted optical fluorescence light from the solid-state spin sensor. Therefore, unwanted amplitude variations (i.e., noise) in the emitted optical fluorescence light can mimic a spurious signal, thereby decreasing device sensitivity. Such amplitude noise on the emitted optical fluorescence light from the solid-state spin sensor should be minimized and its effects mitigated. In some applications, amplitude noise on the emitted optical fluorescence light is the primary limiting factor of device sensitivity. One source of amplitude noise on the emitted optical fluorescence light is vibration or displacement of the solid-state spin sensor relative to the optical excitation radiation source. As the solid-state spin sensor is displaced in the fixed optical excitation radiation field, different regions of the sensor will experience changes in the optical excitation radiation intensity. For example, some regions will see more optical excitation radiation intensity and some regions will see less optical excitation radiation intensity. If the density of color center defects varies with position throughout the solid-state spin sensor, displacement of the solid-state spin sensor can then result in differing amounts of detected optical fluorescence light from the solid-state spin sensor. Minimization of the sensor displacement relative to the optical excitation radiation source will minimize the associated intensity noise of the detected optical fluorescence light, and is preferred to realize devices with the best possible sensitivity. Use of a stiffer materials and mounting schemes for the sensor crystal are ways to mitigate this effect. For example, semi-insulating silicon carbide has a high Young's modulus of roughly 450 GPa. Thus, mounting structures like those disclosed throughout the present disclosure can create a very stable mounting platform for the solid-state spin sensor.

In certain embodiments, semi-insulating silicon carbide may be utilized as the mounting structure. In addition to the high Young's modulus, other optical-related benefits may exist for semi-insulating silicon carbide. Semi-insulating silicon carbide's optical transparency (over wavelengths of approximately 400 nm to several micrometers, with the upper limit of transparency depending on the semi-insulating silicon carbide polytype) may be useful to allow optical excitation radiation delivery through or collection of emitted optical fluorescence light through the semi-insulating silicon carbide wafer. The optical transparency of semi-insulating silicon carbide can simplify troubleshooting of sensors by allowing better observation of the device relative to a device employing an opaque material. Additionally, the high index of refraction of semi-insulating silicon carbide of approximately 2.6 is advantageous in some implementations for confining light using total internal reflection. This is useful for applications such as a parabolic concentrator, solid immersion lens, aspheric condenser, objective or any other light collection or manipulation device. Semi-insulating silicon carbide is birefringent, which may affect the design of imaging optics for some applications. This problem can be accounted for by aligning the extraordinary axis of the semi-insulating silicon carbide with the optical axis of the imaging system, or by using corrective optics to counteract this effect, such as a phase plate.

Reflective Layer

Use of a reflective layer on one or more surfaces of the solid-state spin sensor can also allow for increased collection of emitted optical fluorescence light from the solid-state spin sensor. For example, if the top surface of the solid-state spin sensor is covered with a reflective layer, photons that would otherwise exit through the top surface of the solid-state spin sensor (and not be collected) are instead reflected through the bottom surface of the solid-state spin sensor, allowing collection by the light collection element, which may be an objective or other light collection element as described previously. This reflective layer increases the total number of photons collected from the solid-state spin sensor, and therefore enhances device sensitivity. The reflective layer can be combined with the microwave application structure or these two elements can be kept separate. The reflective layer can consist of a metal (such as silver, copper, etc.) or a dielectric layer. For conductive reflective layers, such as metal reflective layers, the microwave application structure may be designed in conjunction with the conductive reflective layers to act as a single conductive layer for application of microwaves. For imaging implementations, the reflective layer can extend over a portion of the color center defect sensing surface or over the entire color center defect sensing surface. For bulk implementations, the reflective layer can extend over one or more sides of the solid-state spin sensor. A comparison of the difference in the amount of fluorescence light that may be collected is shown in FIG. 4 both for an implementation without a reflective layer (FIG. 4A) and for an implementation employing a reflective layer FIG. 4B).

Figures 4A, 4B:
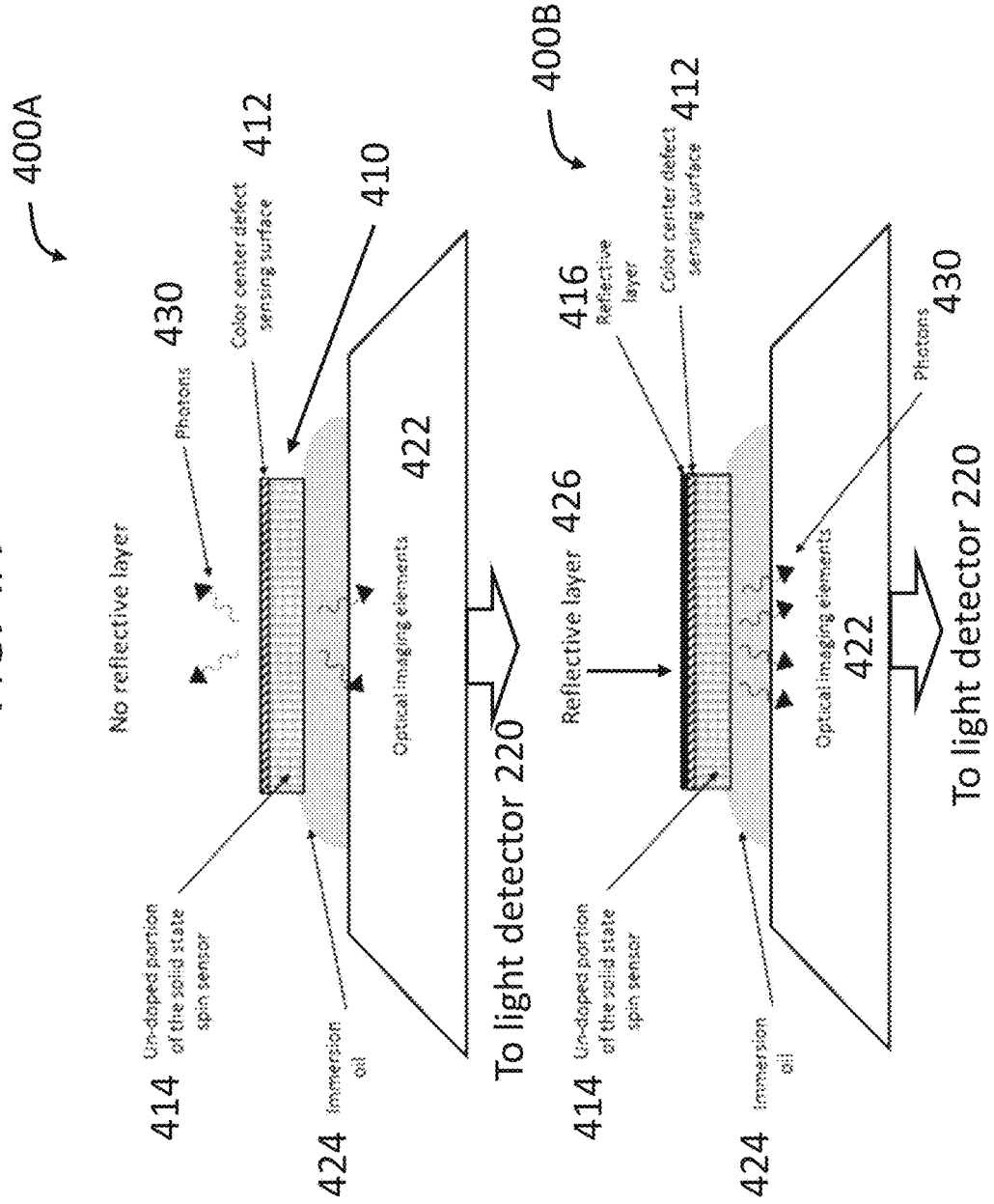
FIGS. 4A and 4B are schematic illustrations of solid-state spin sensor systems that do not employ a reflector (FIG. 4A) and that do employ a reflector (FIG. 4B), demonstrating the increased photon capture.

FIGS. 4A and 4B are schematic illustrations of solid-state spin sensor systems that do not employ a reflective layer (FIG. 4A) and that do employ a reflective layer (FIG. 4B), demonstrating the increased photon capture. As shown in FIG. 4A, system 400A includes a solid-state spin sensor 410 having a color center defect sensing surface 412 and an un-doped portion 414. A sample to be tested, such as biologic material, may sit on the top of the solid-state spin sensor 410. Solid-state spin sensor 410 is contacted by immersion oil that carries photons 420 emitted during measurement to optical imaging elements 422 and then out the other side, for example to light detector 220 of FIG. 2. Optical imaging elements 422 may be, for example, a lens, glass slide, array of lenses, or other known optical devices. Optical imaging elements 422 may direct, focus, or otherwise alter the light emitted by the solid-state spin sensor 410 before collection by a light detector, such as light detector 220 as shown in FIG. 2. However, optical imaging elements 422 do not significantly disrupt the spatial resolution of light emitted by the color center defects in color center defect sensing surface 412 so as to allow for spatially resolved measurement downstream of the optical imaging elements 422. As shown in FIG. 4A, because the color centers emit light isotropically, some of the photons 430 may escape detection through the top of the solid-state spin sensor 410.

FIG. 4B shows similar structures to those in FIG. 4A, but adds reflective layer 426. During operation, photons 430 emitted by color centers that would have traveled upward and away from optical imaging elements 422 in the system of FIG. 4A are instead reflected downward by reflective layer 426 toward optical imaging elements 422. Accordingly, sensitivity may be substantially increased. As described in more detail below, this reflective layer may be used to adhere the solid-state spin sensor 410 to a heat sink and may even be used as an antenna for application of microwaves.

Light Delivery

Proper delivery of optical excitation radiation to the solid-state spin sensor is beneficial to achieve optimal sensor performance. Since the optical excitation radiation applied to the solid-state spin sensor can be as high as several watts in some implementations, the heat load from the optical excitation radiation can burn certain materials commonly used in solid-state spin sensor devices such as but not limited to certain epoxies, super glue, urethane, polyurethane, emersion oils, or plastics such as acrylics. A common material employed to enhance light collection from solid-state spin sensors is immersion oil.

Figure 5A:
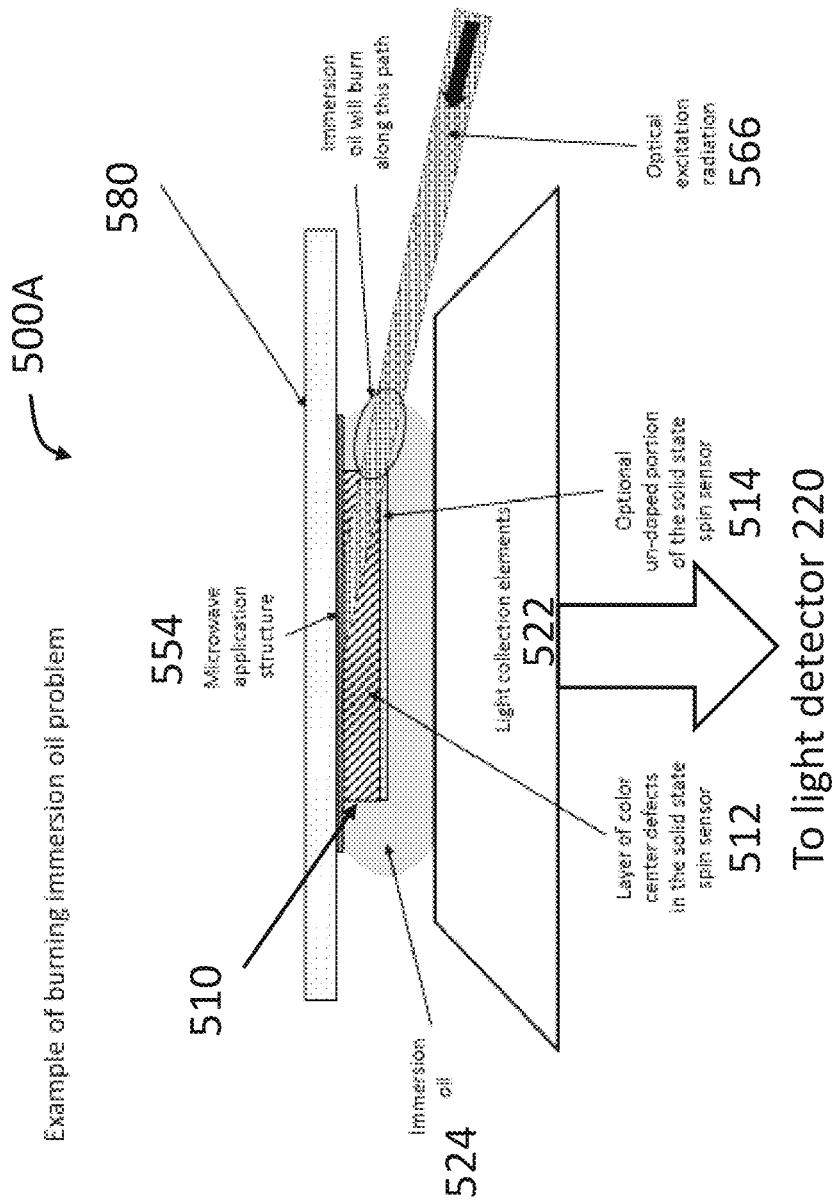
FIGS. 5A and 5B are schematic illustrations of solid-state spin sensor systems that do not employ a light guide (FIG. 5A) and that do employ a light guide (FIG. 5B), demonstrating an ability to avoid immersion oil burning.
Figure 5B:
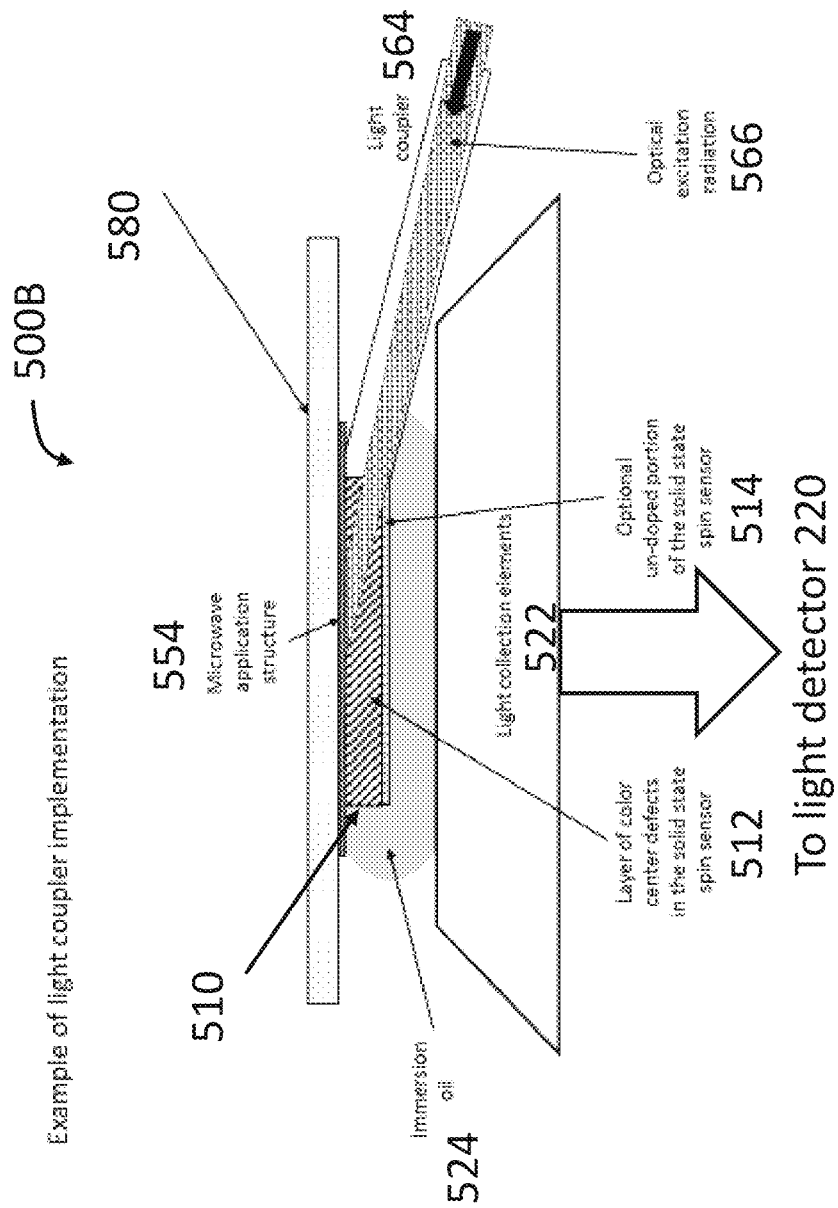

FIGS. 5A and 5B are schematic illustrations of solid-state spin sensor systems that do not employ a light guide 564 (FIG. 5A) and that do employ a light guide 564 (FIG. 5B), demonstrating an ability to avoid immersion oil burning. As shown in FIG. 5A, the solid-state spin sensor system 5A includes a solid-state spin sensor 510 having a layer of color center defects 512 and an optional un-doped portion 514. As described elsewhere in the present disclosure, the size of the layer 512 and the portion 514 may be designed either for spatially resolved or non-spatially resolved measurement. A microwave application structure 554 sits above the solid-state spin sensor 510 and underneath the mounting structure 580. The microwave application structure 554 may be any type of microwave application structure described herein. According to some embodiments the microwave application structure 554 also serves the adhesive to connect solid-state spin sensor 510 to the mounting structure 580. The mounting structure 580 may absorb heat from the microwave application structure 554 and the solid-state spin sensor 510 in order to produce a more accurate and consistent measurement. Furthermore, the mounting structure 580 may add rigidity to the system, as discussed elsewhere in the present disclosure. Light collection element 522 collects light emitted by the solid-state spin sensor 510 that travels through immersion oil 524. Light collection elements 522 may include various types of lenses and/or objectives, such as the optical imaging elements 422 as shown in FIGS. 4A-4B, but may also include other elements such as those which do not enable spatially resolved imaging. Light collection elements 522 may include elements such as lightpipes, ellipsoidal reflectors, aspheric condensers and/or parabolic concentrators. Light collection elements 522 may be a single optical element or multiple optical elements. Light then travels then out the other side of light collection elements 522, for example to light detector 220 of FIG. 2. Since the embodiment of FIG. 5A is a "bulk" device designed for measuring magnetic fields or objects on a size scale that is approximately equal to or larger than the size of the solid-state spins sensor 510, the sample to be tested may be placed anywhere in proximity to the sensor. For example, the embodiment of FIG. 5A may be useful for geomagnetic surveying, searching for iron ore deposits, mapping the magnetic field of the earth, and/or other types of measurements. By contrast, the embodiment of FIGS. 4A-4B is designed for measuring spatially resolved images of small scale samples such as individual biological cells or collections of cells. Thus, while optical imaging elements 422 may also be used in the embodiment of FIG. 5A, a broader range of elements may be used as the light collection elements 522.

As shown in FIG. 5A, optical excitation radiation 566 may be applied to the solid-state spin sensor 510 from the sides of the solid-state spin sensor 510, for example, by a laser source. In order to reach the solid-state spin sensor 510, optical excitation radiation 566 must first travel through immersion oil 5244. This may cause heating or burning of the immersion oil which may degrade measurements. Burning of immersion oil can be avoided by constructing an optically transparent section, which is referred to as a light coupler 564, to deliver the optical excitation radiation to the solid-state spin sensor through the immersion oil. As shown in FIG. 5B, a light coupler 564 may be added to carry light to the solid-state spin sensor 510. Since the optical excitation radiation 566 travels through the light coupler 564 and not through the immersion oil 522, there are no problems with burning the immersion oil. There are also no problems with distortion of the optical excitation radiation 522 by the immersion oil. The light coupler 564 can be constructed of quartz, fused silica, glass, semi-insulating silicon carbide, diamond, sapphire, or any other optically transparent material that is robust to burning at high laser intensity. The light coupler may be adhered to the solid-state spin sensor using an optical adhesive able to withstand high optical excitation radiation intensity.

Microwave Delivery

Metals such as copper and aluminum are widely used for heatsinks and heat spreaders due to their high thermal conductivity, moderate cost, and mechanical robustness. Unfortunately, use of such materials for mounting solid-state spin sensors is sometimes problematic since electrically conductive materials (such as metals) placed near the solid-state spin sensor can interfere with effective delivery of microwave radiation to the solid-state spin sensor. The large electric fields, voltages, or currents created by the microwave radiation can inductively or capacitively couple to nearby metals, drastically altering the microwave characteristics of the device. It is sometimes desirable to avoid this complicated regime. One effective way to avoid this regime is to use an insulating material for the mounting structure (e.g., heat sink or heat spreader/heat sink combination), which allows the heat removal problem and the microwave delivery problems to be solved largely independently. FIG. 3 shows the thermal conductivity of various materials. Materials that are highly electrically conductive (e.g. metals) are shown by black bars, while materials that are electrically insulating (including semi-insulating materials and un-doped semiconductors) are denoted by shaded bars. As shown below in FIG. 3, semi-insulating silicon carbide has the highest thermal conductivity of any currently easily commercially available material other than diamond. Additionally, semi-insulating silicon carbide is an electrical insulator (having a resistivity of approximately $>10^7$ ohm*cm) so its use as a heat sink (or heat spreader/heat sink combination) will not hinder delivering microwave radiation to the solid-state spin sensor. Thus, overall, semi-insulating silicon carbide is an excellent material to use as a mounting material for a solid-state spin sensor. However, as discussed above, other materials may also be used, such as, but not limited to those listed in FIG. 3.

Microwave Application Structure

The microwave radiation may be delivered to the solid-state spin sensor via one or more layers that are located on the solid-state spin sensor, the mounting structure, or both, as described in more detail below with reference to FIGS. 5A-15. This layer may be referred to as the microwave application structure, and can consist of a combination of electrically conductive materials and electrically insulating materials. For example, the microwave application structure can consist of a two-dimensional pattern of electrically conductive material and electrically insulating material. The microwave application structure is used to apply the microwave radiation to the solid-state spin sensor. The microwave application structure may be created via electron evaporation, thermal evaporation, 3D printing, metallic stickers, or other methods. The microwave application structure can employ either resonant structures to reduce the required power for the device, transmission line structures that are inherently broadband and will therefore likely require more power than a resonant structure, or another known antenna design to apply the microwave radiation to the solid-state spin sensor. Specific structures may include, for example, a strip line resonator, split ring resonator, straight rod dipole resonator, quarter wavelength resonator, multiple coupled resonators, microstrip resonator, strip line transmission line, coaxial transmission line, and microstrip transmission line. In some implementations, the microwave application structure also functions to adhere the mounting structure to the solid-state spin sensor. For example, materials like titanium and chromium may act as a "sticky" substance that can adhere two objects, such as the solid-state spin sensor and the mounting structure. The microwave application structure may thus function as both the adhesive and the structure that provides for microwave application, as shown and discussed in more detail with reference to FIG. 6. In these applications, the microwave application structure can allow for high thermal conductance between the mounting structure and the solid-state spin sensor so as to avoid heating the solid-state spin sensor. The location of the microwave application structure is described in more detail below.

Metal Bonding

According to some embodiments, high thermal conductance between the solid-state spin sensor and the mounting structure is important for device performance. According to some embodiments, a method for bonding a solid-state sensor host material (e.g., diamond), to mounting structure is provided. The bonding of the solid-state spin sensor (e.g., diamond) to the mounting structure can be done to maximize thermal contact between the solid-state spin sensor (e.g., diamond) and the mounting structure.

In the illustrative example of a semi-insulating silicon carbide mounting structure and a diamond solid-state spin sensor, a method for bonding the diamond to metal can be adapted as follows: both the mounting structure (for example, a semi-insulating silicon carbide wafer) and the diamond surface can be plated with titanium first, then platinum, and lastly gold. The two pieces can then be positioned so that the gold surfaces of each are in close contact, and soldered together. The rationale for this method is as follows: Titanium forms a carbide with the diamond, ensuring a strong mechanical bond with high thermal contact. Platinum is added in between to act as a diffusion barrier while gold allows for soldering. An image of this process is depicted in FIG. 6.

Figure 6:
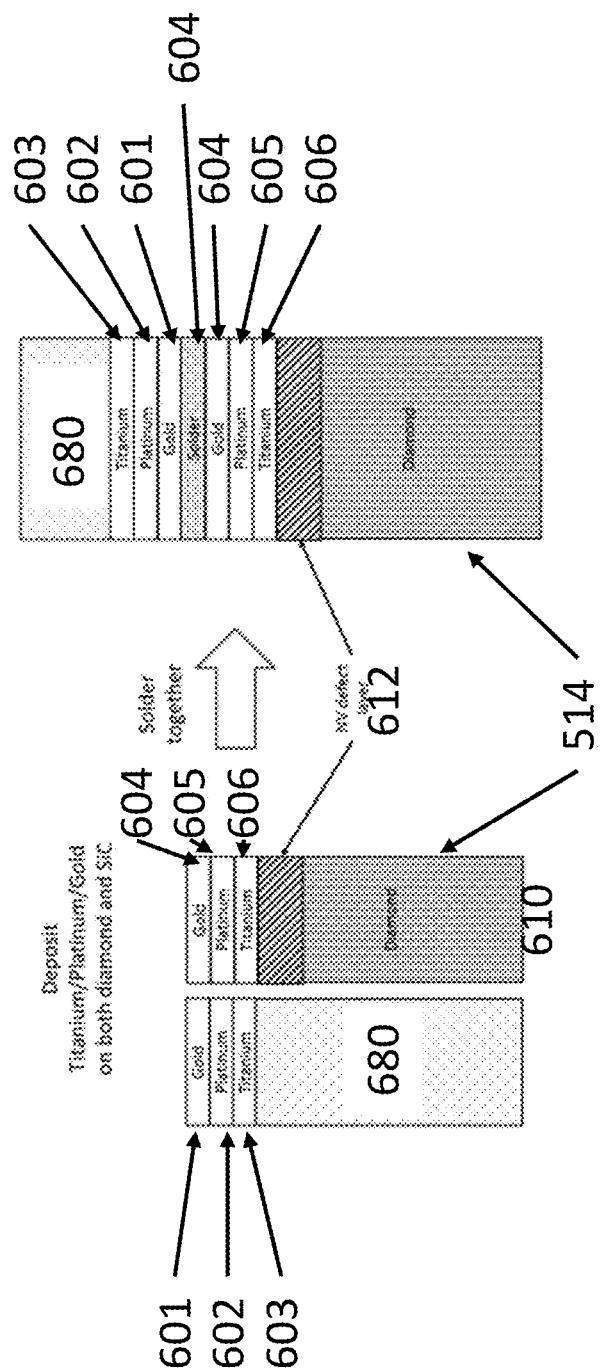
FIG. 6 is a schematic illustration showing one possible method to bond diamond to semi-insulating silicon carbide.

As shown in FIG. 6, the mounting structure 680 may first be coated with a titanium layer 603, a platinum layer 602, and a gold layer 601 using any known methods for coating/applying such layers. The solid-state spin sensor 610 may be coated with similarly with titanium layer 604, a platinum layer 605, and a gold layer 606. As shown in FIG. 6, this is accomplished on the side with color center defects, such as NV defects implanted in NV defect layer 612. However, depending on the desired orientation of the solid-state spin sensor, this may instead be done on the un-doped portion 514. As shown in FIG. 6, solder 604 is then applied to the gold layer 601, the gold layer 604, or both, and the solid-state spin sensor 610 and the mounting structure 680 are joined.

For applications that do not demand maximum possible thermal performance, the thermal joining of the solid-state spin sensor to the mounting structure can be done using any adhesive, and/or, beneficially using silver-filled epoxy or other high thermal conductivity adhesive. This method is easier, cheaper and less permanent than the soldering method outlined above. Metallic indium or lead can be used as well. Alternatively, for diamond solid-state spin sensors, the single crystal diamond substrate can be adhered to the mounting structure (such as a semi-insulating silicon carbide wafer or substrate) by growing polycrystalline diamond between the adhering surfaces of the mounting structure and diamond solid-state spin sensor.

FIGS. 7-15 show exemplary physical implementations of mounting schemes for the solid-state spin sensor. According to some embodiments, there is a difference between mounting schemes for "bulk" solid-state spin sensors, in which the entire solid-state spin sensor is used as a single channel detector, and "imaging" solid-state spin sensors, which employ a layer of color center defects referred to as the color center defect sensing surface and a microscope-type configuration to make a spatial image of the physical quantity to be sensed.

Light Collection Element

In some implementations, the sensitivity of the overall solid-state spin sensor device is inversely proportional to the square root of the number of detected optical fluorescence photons that impinge on the light detector. Thus, it is advantageous to collect as many photons as possible to achieve the best possible sensitivity. There are many methods available to increase the fraction of photons that are successfully guided to the light detector (relative to the total number of emitted optical fluorescence photons). The methods and systems outlined in the present disclosure are compatible with such methods. According to an embodiment, a high numerical aperture objective or a high numerical aperture lens is used. Other methods include the use of a parabolic reflector, an ellipsoidal and hemispherical reflector combination, or a light pipe. For example, examples of light collection techniques compatible with the system and methods disclosed herein, see the following publications:

Microscope Objective: LeSage et al., "Optical Magnetic Imaging of Living Cells", Nature vol. 486 (25 Apr. 2013)

Aspheric Optics: Schloss et al., "Simultaneous Broadband Vector Magnetometry Using Solid-State Spins," arXiv: 1803.03718v2 (28 Mar. 2018)

Light Pipe: U.S. Pat. No. 9,720,055 B1 issued Aug. 1, 2017.

Parabolic Concentrator: Wolf et al., "Subpicotesla Diamond Magnetometry," Phys. Rev. X 5,041001 (2015).

Bulk Implementations

Figure 7:
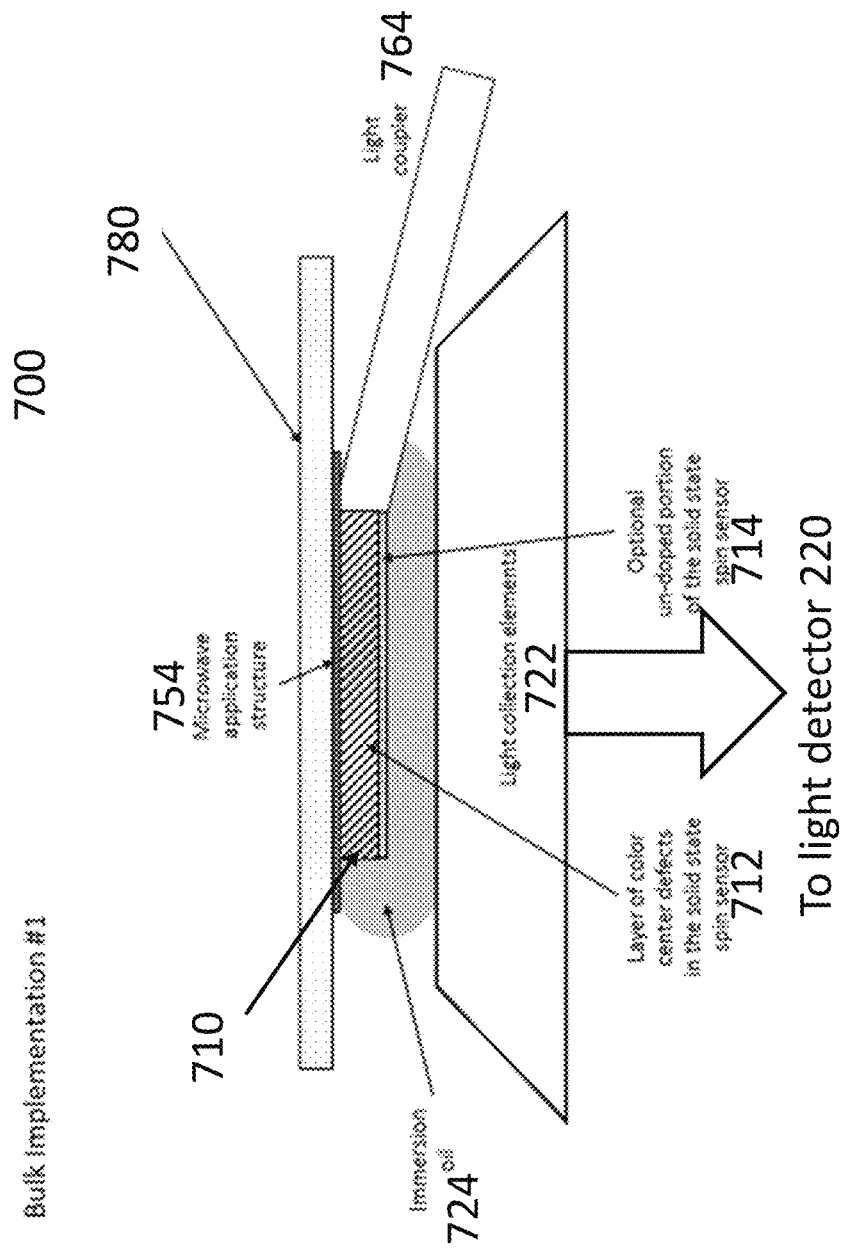
FIGS. 7-9 are schematic illustrations showing various solid-state spin sensor systems suitable for use in a bulk implementation, according to one or more embodiments.

According to some embodiments that can be used for bulk implementation, the microwave application structure may be placed between the solid-state spin sensor and mounting structure. FIG. 7 is such an example implementation, according to an embodiment. As shown in FIG. 7, the solid-state spin sensor system 700 includes a solid-state spin sensor 710 having a layer of color center defects 712 and an optional un-doped portion 714. A microwave application structure 754 sits above the solid-state spin sensor 710 and underneath the mounting structure 780. According to some embodiments, the microwave application structure 754 also serves as the adhesive to connect solid-state spin sensor 710 to the mounting structure 780. The mounting structure 780 may absorb heat from the microwave application structure 754 and the solid-state spin sensor 710 in order to produce a more accurate and consistent measurement. Furthermore, the mounting structure 780 may add rigidity to the system, as discussed elsewhere in the present disclosure. Light collection element 522 collects light emitted by the solid-state spin sensor 510 that travels through immersion oil 524.

As shown, for example, in FIG. 7, the microwave application structure 754 is fabricated using a thin layer (for example, 10 nanometers to 20 micrometers) of a combination of electrically insulating and electrically conductive materials. The microwave application 754 structure is fabricated in a thin layer so that it can provide high thermal conductance between the solid-state spin sensor and the mounting structure. The microwave application 754 may span the entire connecting surface between mounting structure 780 and solid-state spin sensor 710, a part thereof, or any other configuration suitable to provide microwave signals. According to some embodiments, gaps in the plane of the microwave application structure 754 between mounting structure 780 and the solid-state spin sensor 710 are filled with a conductive adhesive so as to provide high thermal conductivity across the entire interface. Microwave application structure 754 may be reflective, and thereby increase light yield as discussed with reference to FIG. 4B.

The color center defects in the layer of color center defects 712 of the solid-state spin sensor 710 may be localized to the surface in contact with the microwave delivery structure, or may be uniformly distributed throughout the solid-state spin sensor, or may have some other distribution, as is shown in more detail with reference to various figures in the present disclosure. Optical excitation radiation may be applied to the solid-state spin sensor through one side of the solid-state spin sensor or through another face of the solid-state spin sensor (for example, from above or below, or from one of the sides). However, as shown in FIG. 7, a light coupler 764 is used to deliver light to the solid-state spin sensor 710 so as to avoid burning of immersion oil 725. The collection of emitted optical fluorescence light from the solid-state spin sensor may be accomplished using an oil objective 722 and immersion oil 724. According to some embodiments, light may be collected using an air objective, or by various other methods, as described herein. Light then travels then out the other side of light collection elements 722, for example to light detector 220 of FIG. 2.

Figure 8:
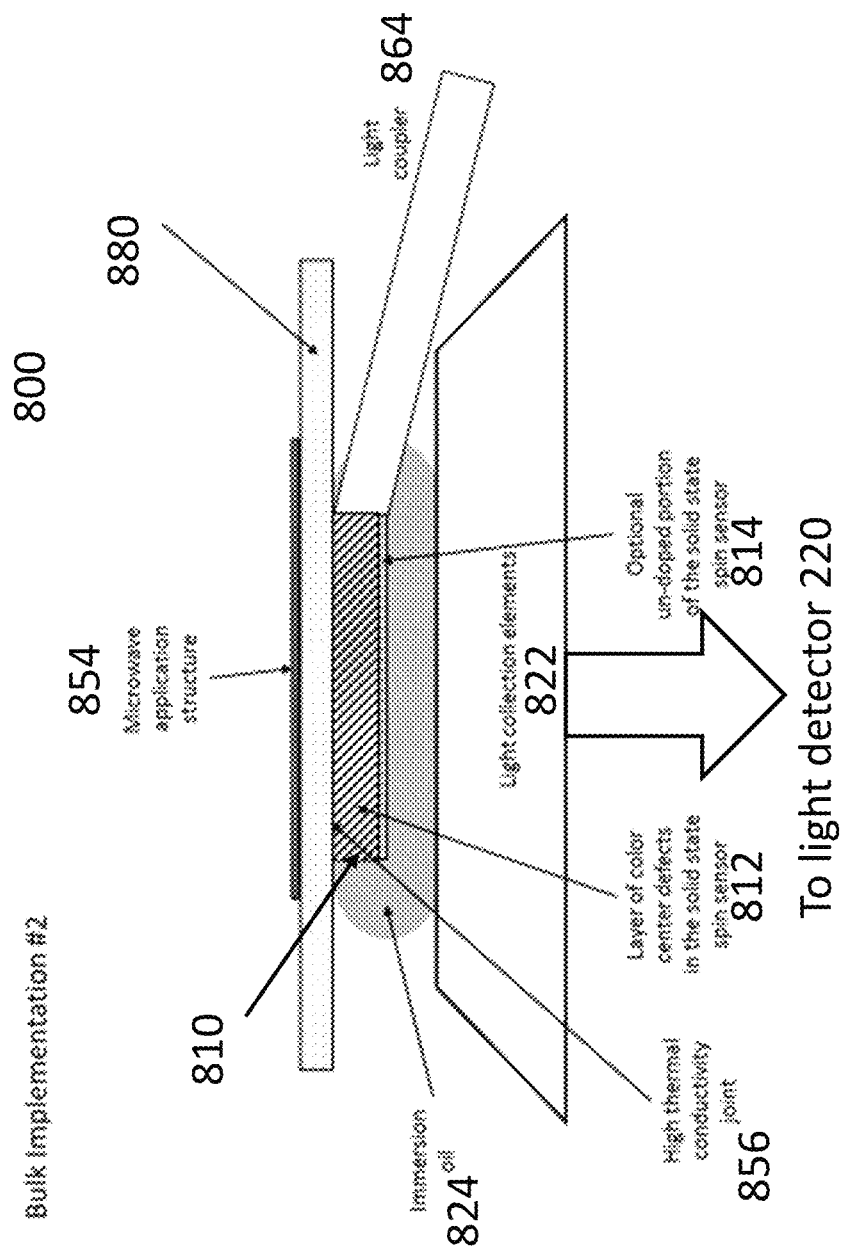

FIG. 8 shows another implementation for bulk sensing, according to an embodiment. As shown in FIG. 8, the solid-state spin sensor system 800 includes a solid-state spin sensor 810 having a layer of color center defects 812 and an optional un-doped portion 814, immersion oil connecting the solid-state spin sensor 810 to the light collection element 822, light coupler 864 for introduction of light to the solid-state spin sensor 810, and mounting structure 880. As shown in FIG. 8, the solid-state spin sensor 810 is adhered directly to the mounting structure 880 with a high thermal conductance method, such as via thermally conductive adhesive. The microwave application structure 854 is patterned on the side of the mounting structure 880 opposite the solid-state spin sensor 810. The microwave radiation is applied to the color center defects in the layer of color center defects 812 of the solid-state spin sensor 810 using the microwave application structure 810. The color center defects in the solid-state spin sensor 810 may be localized near the surface in contact with the mounting structure 880, or may be uniformly distributed throughout the solid-state spin sensor, or may have some other distribution. Optical excitation radiation may be applied to the solid-state spin sensor through one side of the solid-state spin sensor or through another face of the solid-state spin sensor. However, as shown in FIG. 8, the optical excitation radiation can be delivered to the solid-state spin sensor using a light coupler 864. According to some embodiments, an optical fiber or other light delivery structures are used. The collection of emitted fluorescence light from the solid-state spin sensor may be accomplished using an oil objective as light collection element 822 and immersion oil 824. According to some embodiments, an air objective or various other methods may be used. Light then travels then out the other side of light collection elements 822, for example to light detector 220 of FIG. 2.

Figure 9:
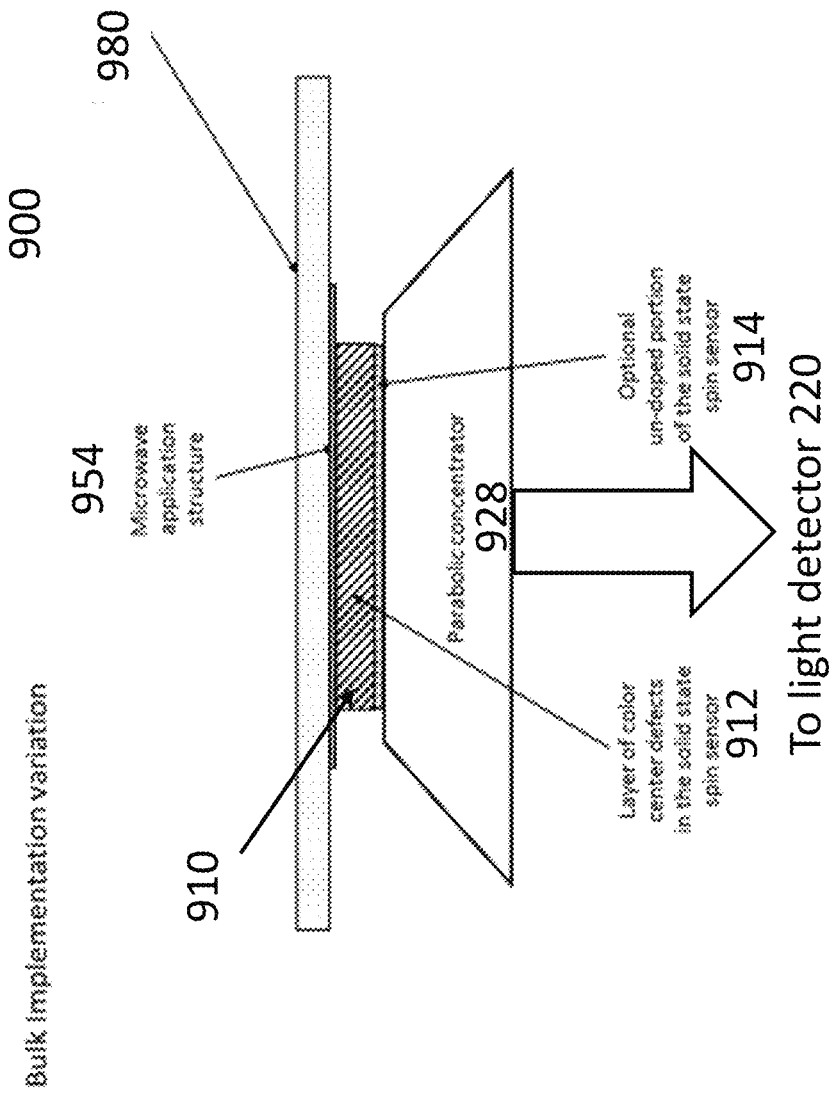
Figure 10:
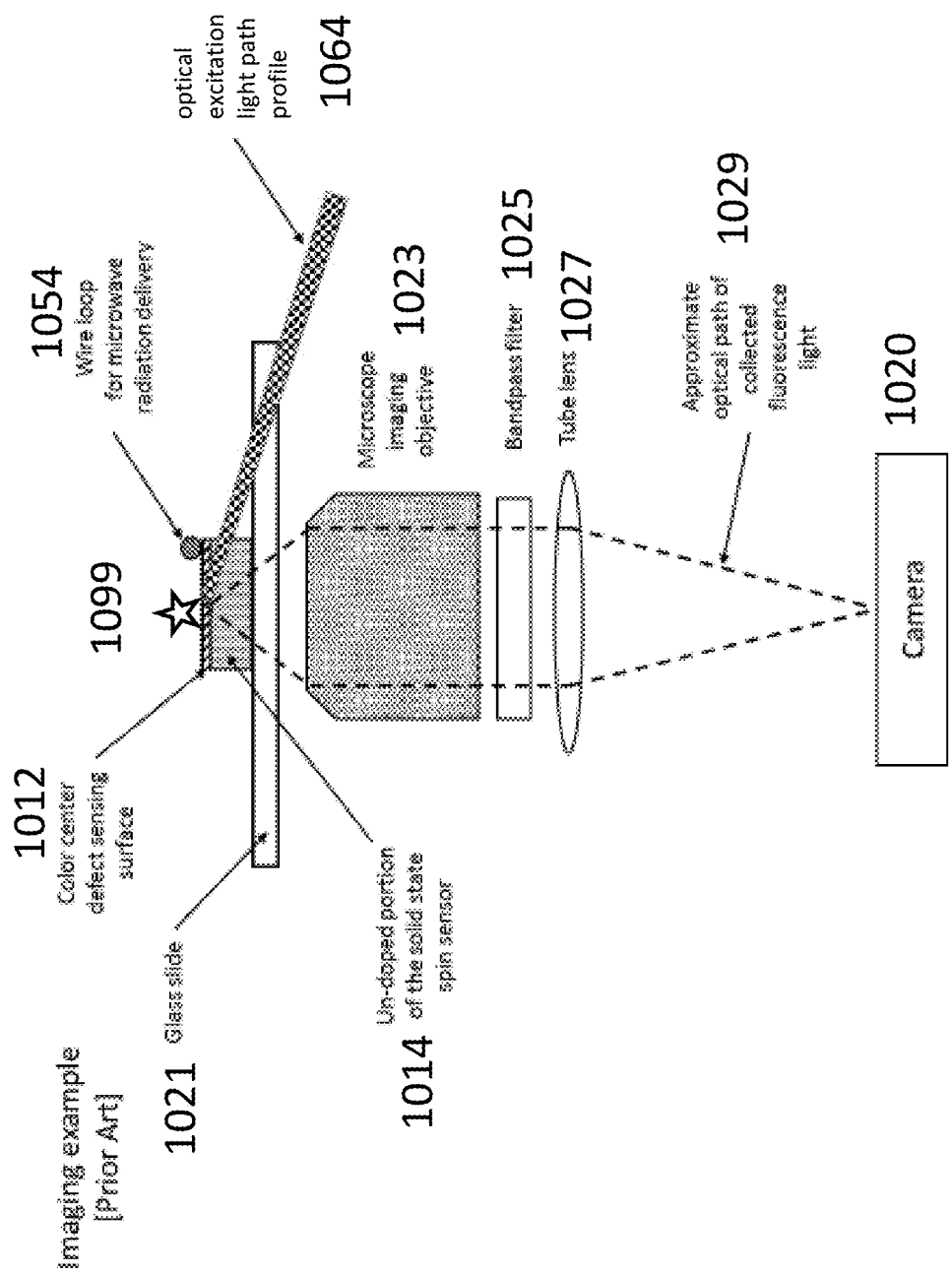
FIG. 10 is a schematic illustration of a conventional imaging solid-state spin sensor system.

There are several variations of the systems 700 and 800, which can be achieved by varying the method of light collection. For example, collection of the emitted optical fluorescence light can be done with a parabolic concentrator 928 rather than an objective as shown in FIG. 9. Light then travels then out the other side of parabolic concentrator 928, for example to light detector 220 of FIG. 2. As shown in FIG. 9, the solid-state spin sensor system 900 includes a solid-state spin sensor 910 having a layer of color center defects 912 and an optional un-doped portion 914, light collection element 922, and mounting structure 980.

Imaging Implementations

Solid-state spin sensors can also be used in an imaging modality to create spatially resolved images or videos of a physical quantity. In this configuration, the solid-state spin sensor may be set up similar to an optical microscope, such as the configuration shown in FIG. 10. For this purpose, the solid-state spin sensor is usually fabricated with the color center defects located in a layer 1012 on one surface of the solid-state spin sensor. This layer can be very thin, from a few nanometers thick to several tens of micrometers thick (for example, 10 nanometers to 20 micrometers). This surface may be referred to as the color center defect sensing surface 1012. An object 1099 or collection of objects to be imaged may be placed on the color center defect sensing surface 1012. The necessary microwave radiation and optical excitation radiation are applied to the color center defect sensing surface via wire loop 1054 and light path 1064. Optical excitation radiation may be, for example, light from a 532 nm laser. The emitted optical fluorescence light from the color center defect sensing surface is imaged onto a light detector, typically a camera 1020 (although photodiode, photo-multiplier tube, avalanche photodiode, photodiode array, digital pixel focal plane array, etc., are also feasible). From the image of the emitted optical fluorescence light and known microwave radiation applied to the solid-state spin sensor, the physical quantity to be measured is mapped out over the color center defect sensing surface. In this way, an image can be made of the physical property to be measured.

In this prior art implementation, the solid-state spin sensor is placed on a glass slide 1021 with the color center defect sensing surface 1012 opposite the surface in contact with the glass slide 1021. The optical excitation radiation is applied either through one side of the diamond via excitation path 1064 or through the objective in a total internal reflection fluorescence (TIRF) configuration or in another manner. The emitted optical fluorescence light originating from the color center defect sensing surface 1012 is collected through the glass slide 1021 by a microscope objective 1023 or other imaging optic. The emitted optical fluorescence light is then bandpass filtered via bandpass filter 1025 and focused using a tube lens 1027 onto a camera 1020.

Embodiments for improving an integrated mounting system and mounting structure are discussed with respect to FIGS. 11-15. Variations among these and other embodiments may be combined, added, or removed to other embodiments in accordance with the methods and systems described herein.

Figure 11:
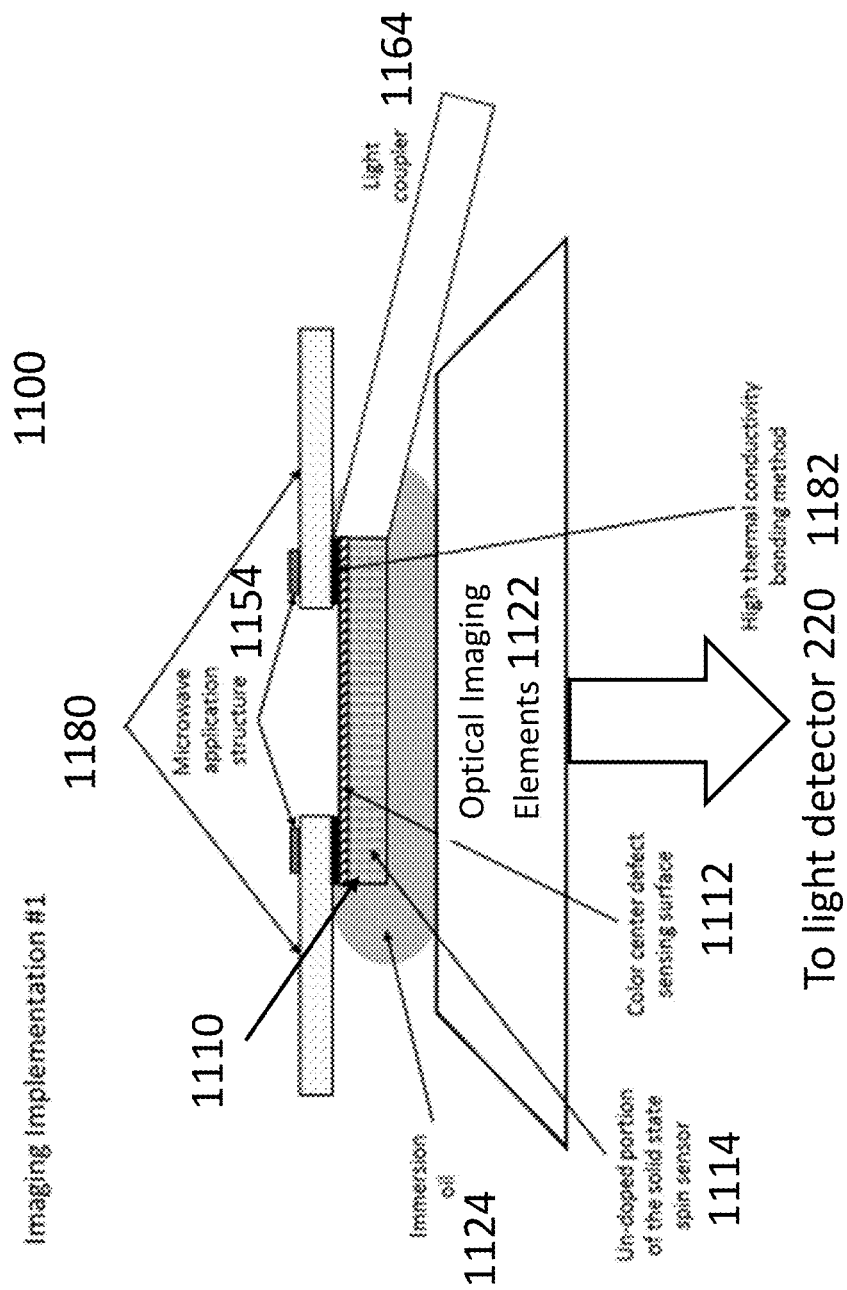
FIGS. 11-15 schematic illustrations showing various solid-state spin sensor systems suitable for use in an imaging implementation, according to one or more embodiments.

FIG. 11 shows a sliced view of a system 1100, which includes a solid-state spin sensor 1110 having a layer of color center defects 1112 and an optional un-doped portion 1114, optical imaging elements 1122, mounting structure 1180, light coupler 1164, and microwave application structure 1154, according to an embodiment. As shown in FIG. 11, in order to allow for spatially resolved imaging, the solid-state spin sensor 1110 is affixed to a large mounting structure, such as but not limited to wafer of semi-insulating silicon carbide 1180 via a high thermal conductance bonding (e.g., high thermal conductivity bonding adhesive) method 1182 along the exterior of the color center defect sensing surface 1112. It is beneficial when this bonding method provides high thermal conductance between the solid-state spin sensor and the mounting structure. The mounting structure 1180 may have a hole in the middle of the wafer, thereby allowing specimens or other objects to be placed directly on the color center defect sensing surface for measurement. The microwave radiation is applied via the microwave application structure 1154 deposited on the mounting structure 1180. Emitted optical fluorescence light from the color center defect sensing surface is collected via a light collection element placed below the solid-state spin sensor, such as optical imaging elements 1122. Light then travels then out the other side of optical imaging elements 1122, for example to light detector 220 of FIG. 2. A light coupler 1164 may connect to the solid-state spin sensor from a side, allowing high power laser light to impinge on the color center defect sensing surface within the solid-state spin sensor without passing through any immersion oil 1124. The optical excitation radiation may be delivered to the solid-state spin sensor in other ways, as discussed above. The hole in the mounting structure 1180 may take a variety of shapes such as a circle, oval, or rectangle, and may preferably be smaller than the solid-state spin sensor 1110 so as to allow some overlap for adhesive 1182. According to some embodiments, a reflective layer is disposed above the solid-state spin sensor 1110 in order to reflect light downward to optical imaging elements 1122.

Figure 12:
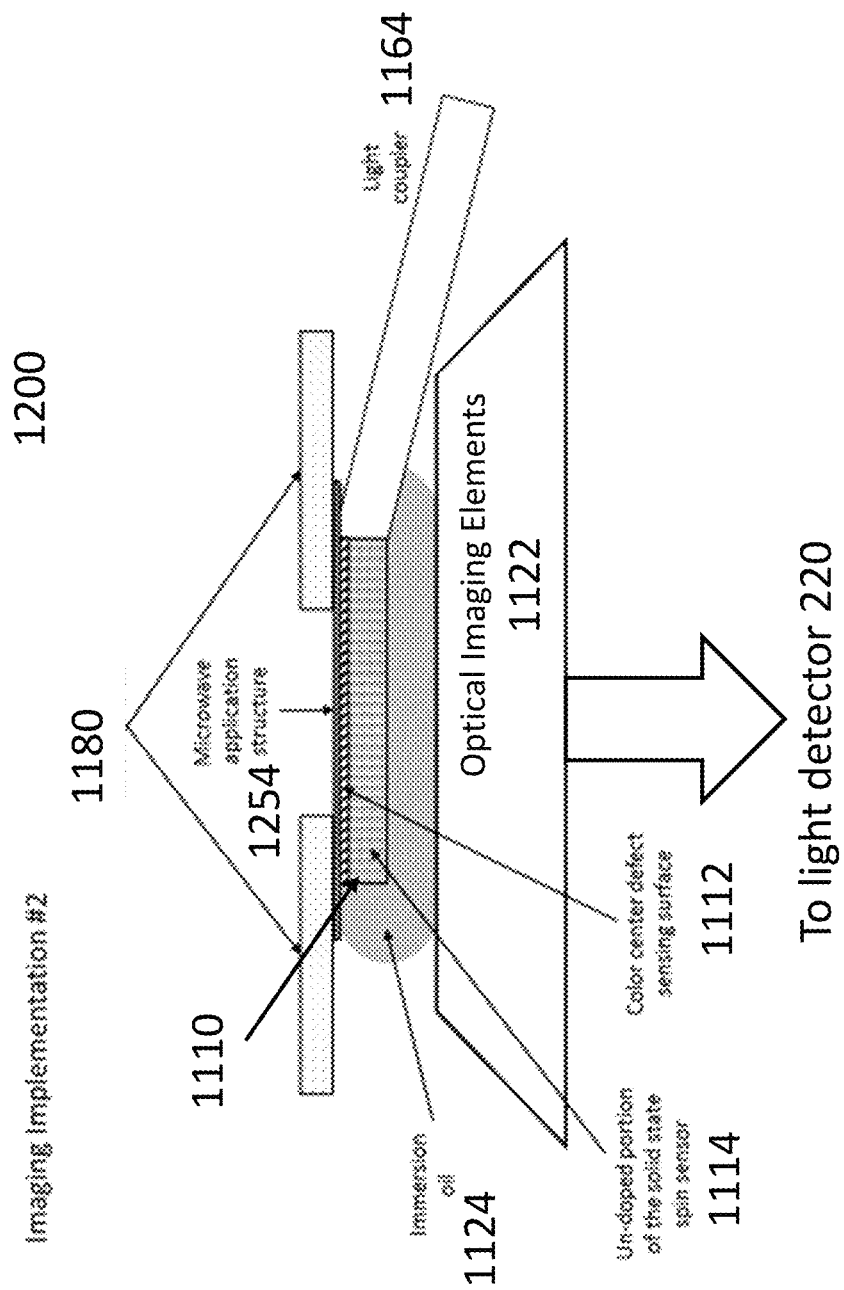

According to an embodiment, as shown in FIG. 12, the overall configuration 1200 is similar to that of FIG. 11 except that the bonding of the solid-state spin sensor to the mounting structure and the microwave application structure are combined as microwave application structure 1254. The microwave application structure 1254 may be deposited on the entire, most of, or a portion of the color center defect sensing surface of the solid-state spin sensor 1112. In this implementation, if the microwave application structure 1254 spans the sensing surface 1112, it is typically thin (a hundred nm or less) to result in minimal increase in stand-off distance between the solid-state spin sensor and the objects to be imaged, which are typically placed on top of the microwave application structure. In some implementations, the microwave application structure may be made sufficiently reflective, such that emitted optical fluorescence light from the color center defect sensing surface that would otherwise exit through the top surface 1112 of the solid-state spin sensor is instead reflected down into the optical imaging elements 1122. This can substantially increase the amount of detected optical fluorescence light. Light then travels then out the other side of optical imaging elements 1122, for example to light detector 220 of FIG. 2. The optical excitation radiation is guided to the solid-state spin sensor through a light coupler 1164 (which can be made of glass for example), which allows the high-power laser light to impinge on the solid-state spin sensor without passing through any immersion oil 1124. The hole in the mounting structure 1180 may take a variety of shapes such as a circle, oval, or rectangle, and may preferably be smaller than the solid-state spin sensor 1110 so as to allow some overlap to allow the solid-state spin sensor 1110 and the mounting structure 1180 to be adhered together, for example, via the microwave application structure 1254 or via adhesive on one or more sides of the microwave application structure 1254.

Figure 13:
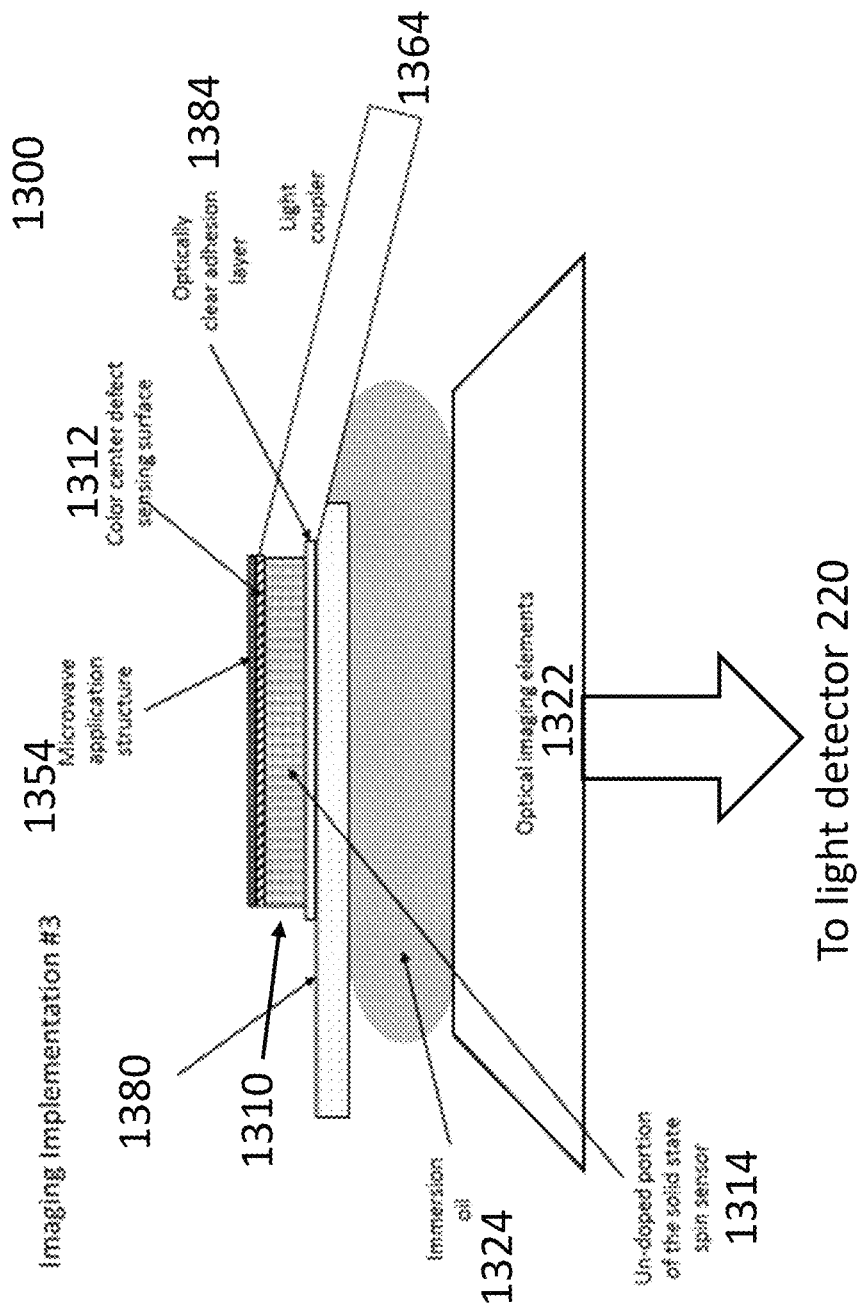

According to an embodiment, as shown in the system 1300 of FIG. 13, the solid-state spin sensor 1310 is affixed to mounting structure 1380 via a transparent epoxy or some other transparent adhesive 1384, preferably with high thermal conductivity, for example Gorilla Glue®, cyanoacrylate, Loctite® 454 or 495, Super Glue®, or other known adhesives. The bonding material should be transparent to allow imaging of the color center defect sensing surface through the interface between the solid-state spin sensor and the mounting structure. The microwave radiation is applied through the microwave application structure 1354 similar to that in FIG. 12, which is deposited on the color center defect sensing surface. In this implementation, the microwave application structure 1354 is typically thin (for example, 10 nanometers to 20 micrometers, or 10-100 nanometers) to result in minimal increase in stand-off distance between the solid-state spin sensor 1310 (in particular, the color center defect sensing surface 1312) and the objects to be imaged, which are typically placed on top of the microwave application structure. In some implementations, the microwave application structure 1354 may be made sufficiently reflective, such that emitted optical fluorescence light from the color center defect sensing surface 1312 that would otherwise exit through the top surface of the solid-state spin sensor is instead reflected down into the light collection element. This can substantially increase the amount of detected optical fluorescence light. The optical excitation radiation may be guided to the solid-state spin sensor through a light coupler 1364 (which can be made of glass for example), which allows the high-power laser light to impinge on the solid-state spin sensor without passing through any immersion oil 1322 to avoid burning of the immersion oil 1322. The mounting structure 1380 and optically clear adhesion layer 1384 are preferably transparent to allow for sufficient light transmission to the optical imaging elements 1322. Light can travel out the bottom side of objective 1322, for example to light detector 220 of FIG. 2.

Figure 14:
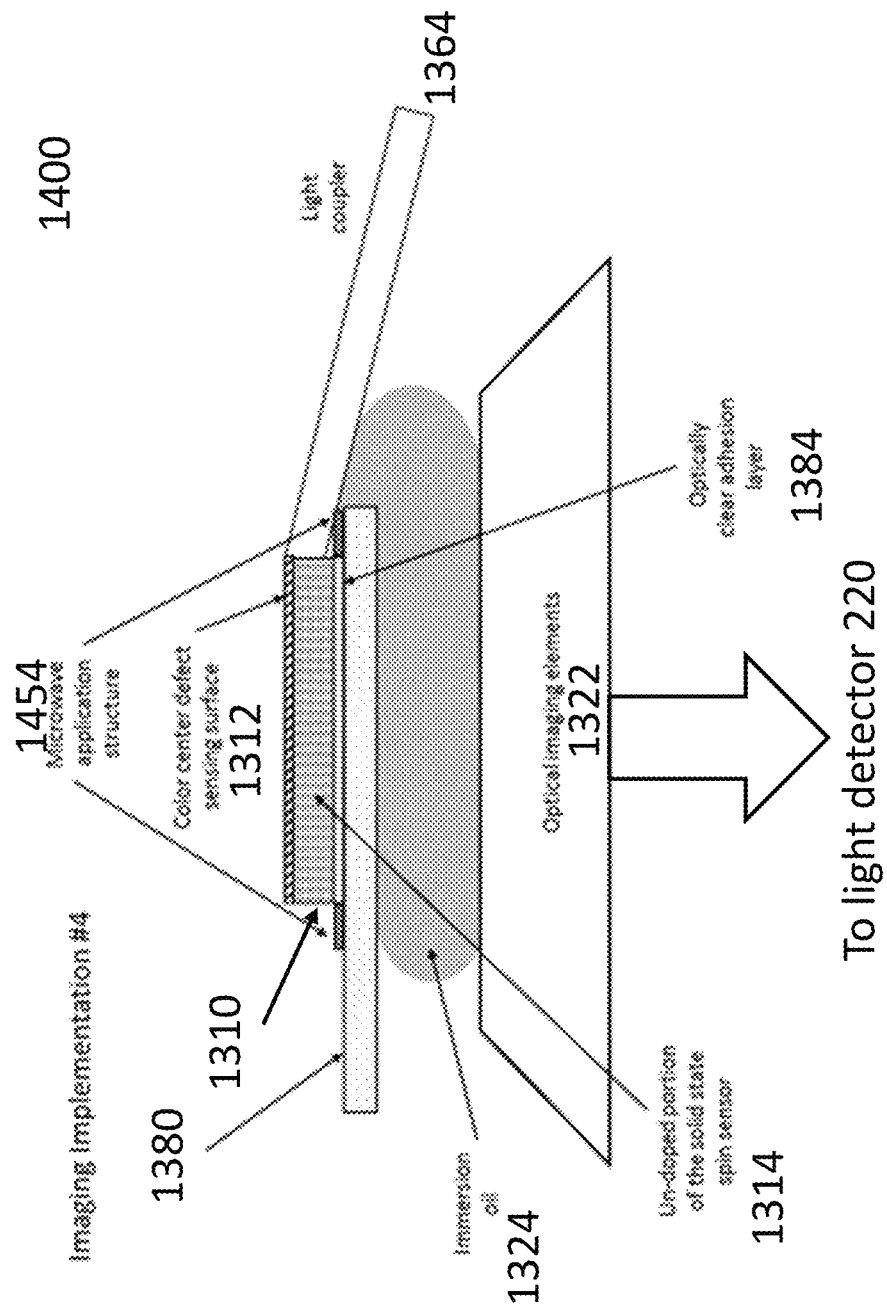

According to an embodiment, FIG. 14 shows a modification 1400 of the implementation shown in FIG. 13, with the change that the microwave application structure 1454 is deposited on the mounting structure 1380 rather than directly on the solid-state spin sensor 1310. This allows the heat load from resistive losses in the microwave application structure to be directly applied to the mounting structure 1380, rather than to the color center defect sensing surface 1312 of the solid-state spin sensor 1310.

Figure 15:
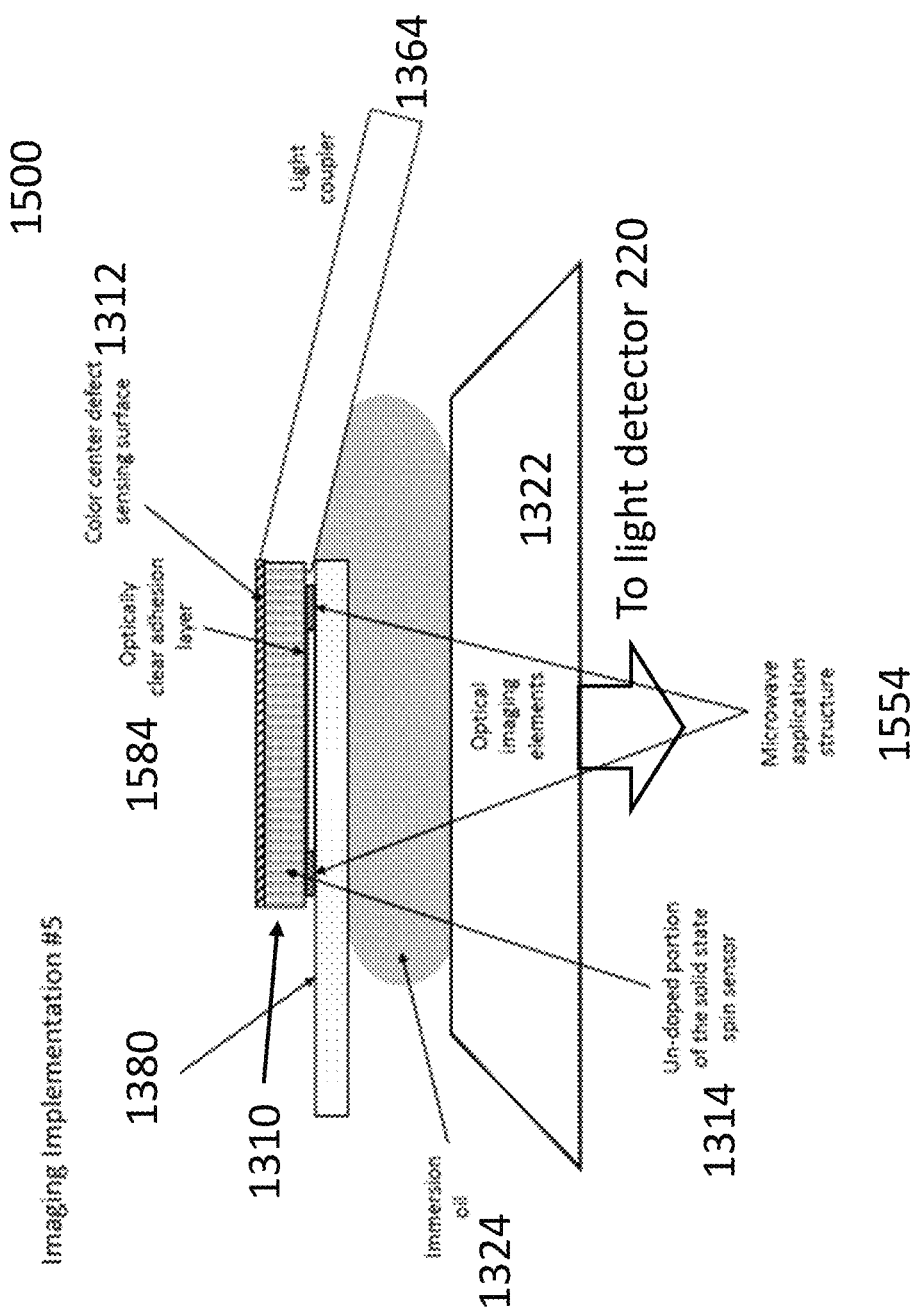

According to an embodiment, as shown in FIG. 15, the microwave application structure 1554 in system 1500 consists of metal deposited in a thin layer between the solid-state spin sensor 1310 and the mounting structure 1380. Gaps in the deposited metal are filled with a clear optically clear adhesion layer 1584. Leaving a gap that is later filled with optical adhesion layer 1584 provides a region through which light can pass to immersion oil 1324 and optical imaging elements 1322 without obstruction by the microwave application structure 1554. However, optically clear adhesion layer 1584 allows for thermal conductivity between the solid-state spin sensor 1310 and the mounting structure, thereby improving measurement accuracy and consistency even when large amounts of light are provided by light coupler 1364.

The embodiments discussed in the present disclosure, such as the embodiments discussed in more detail with reference to FIGS. 4A-5B, 7-15, and 17 may be manufactured using a variety of methods. For example, the solid-state spin sensor may be provided with a plurality of color center defects. For example, the crystal of the solid-state spin sensor may be grown either with the desired color center defect present or with a precursor to the desired color center defect. According to some embodiments, the color center defects are implanted. The solid-state spin sensor may be mounted on the mounting structure. The microwave application structure may be disposed on the mounting structure, either before or after mounting the solid-state spin sensor. Disposing of the microwave application structure may be accomplished, for example, by printing.

Thermal Performance Data

Figure 16:
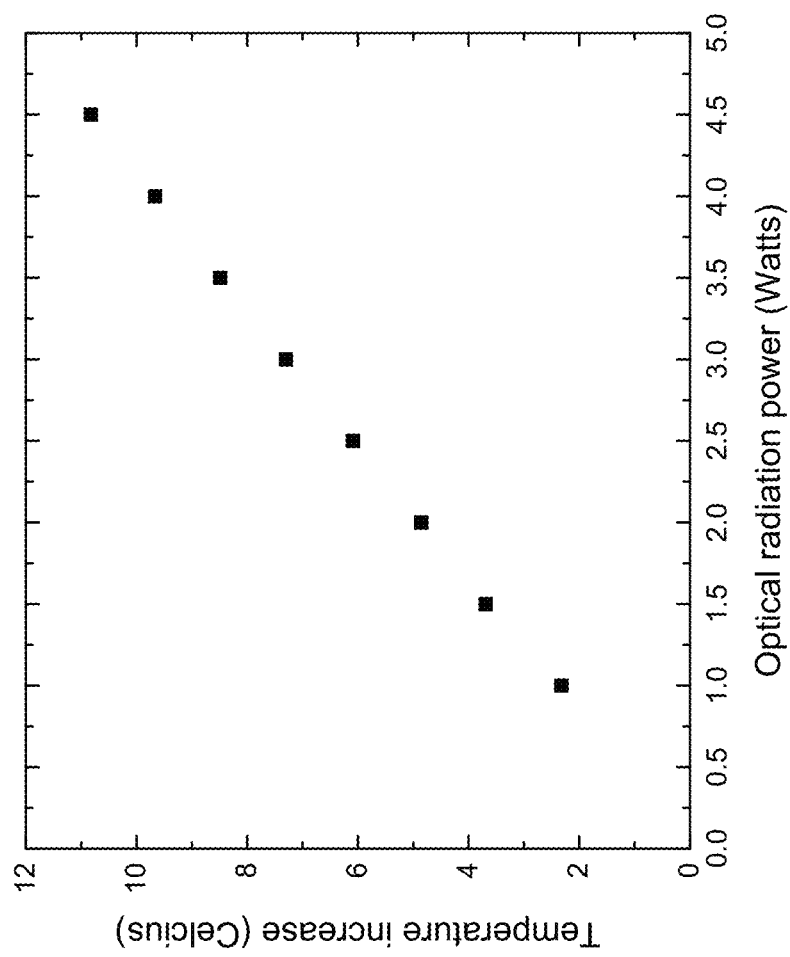
FIG. 16 is a plot of temperature versus optical excitation radiation power applied to a diamond solid-state spin sensor bonded to a 2-inch-diameter wafer of semi-insulating silicon carbide.
Figure 17:
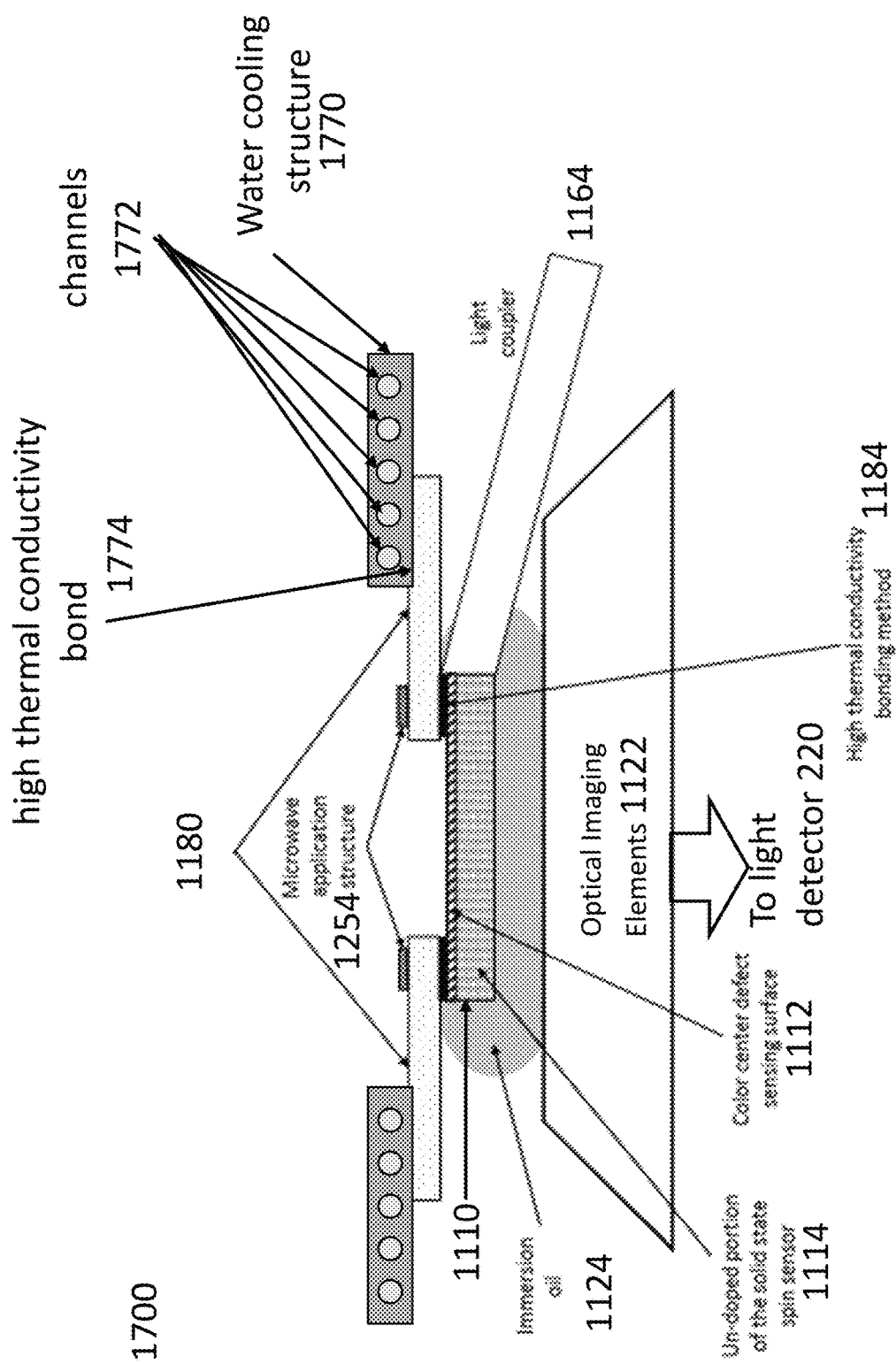
FIG. 17 is a schematic illustration showing a water cooling structure.

A benefit of the some of the embodiments described herein is a vastly improved heat removal rate from the solid-state spin sensor through the mounting structure, such as a semi-insulating silicon carbide layer. As heat is removed faster or more efficiently from the solid-state spin sensor with this method, the result is a solid-state spin sensor that exhibits reduced fluctuations of temperature relative to other mounting methods. Instead of evaluating the amplitude of resulting temperature fluctuations directly, susceptibility to temperature fluctuations can be approximately evaluated by observing the temperate change under different optical excitation radiation heat loads. Devices that exhibit lower changes in temperature with this test will exhibit lower temperature fluctuations in real-world applications. Shown in FIG. 16 is a plot of temperature versus optical excitation radiation power applied to a diamond solid-state spin sensor bonded to a 2-inch-diameter wafer of semi-insulating silicon carbide. The experimental conditions correspond roughly to FIG. 11, as described above. Under application of 4.5 watts of 532 nm continuous wave (CW) laser light, the diamond's temperature increases only 11 degrees Celsius above ambient temperature. The addition of water cooling to either the semi-insulating silicon carbide substrate or to the diamond itself could further decrease this temperature rise. For example, FIG. 17 shows an embodiment similar to that shown in FIG. 11 with the addition of water cooling structure 1770. Water cooling structure 1770 may be affixed to the mounting structure with high a high thermal conductivity bond 1774 and includes channels 1772 through which water may be pumped in order to cool the mounting structure 1180. Heat may be transferred from mounting structure 1180 to the water cooling structure 1770 via high thermal conductivity bond 1774. As water passes through channels 1772, it receives thermal energy from the water cooling structure 1770. Accordingly, the temperature of solid-state spin sensor 1110 may be better regulated without the need for a mounting structure 1180 that is significantly larger than solid-state spin sensor 1110. Small changes in device temperature may also be desirable when working with samples that cannot withstand large deviations in temperature from ambient temperature, such as biological samples. A similar diamond which was not heat-sunk displayed a temperature coefficient of 200 degrees Celsius/watt.

The invention claimed is:

1. A solid-state spin sensor system, comprising:
    a solid-state spin sensor having a plurality of color center defects; a mounting structure, wherein the mounting structure is in thermal contact with the solid-state spin sensor such that thermal energy flows from the solid-state spin sensor to the mounting structure; and
    a microwave application structure, disposed on a face of the mounting structure or a face of the solid-state spin sensor for applying microwave radiation to the solid-state spin sensor.

2. The solid-state spin sensor system of claim 1, wherein the mounting structure is positioned and arranged to mechanically support the solid-state spin sensor.

3. The solid-state spin sensor system of claim 1, wherein the mounting structure is a thin layer having a thickness between 50 micrometers to 2 centimeters.

4. The solid-state spin sensor system of claim 1, wherein the microwave application structure is disposed on the face of the mounting structure that is proximal to the solid-state spin sensor.

5. The solid-state spin sensor system of claim 4, wherein a first side of the microwave application structure is fixed to a face of the mounting structure, and the solid-state spin sensor is fixed to a second side of the microwave application structure opposite the first side of the microwave application structure,
    the solid-state spin sensor system further comprising:
    a light collection element configured to collect light emitted from the color center defects in the solid-state spin sensor traveling in a direction moving away from the second side of the microwave application structure.

6. The solid-state spin sensor system of claim 5, wherein the mounting structure further comprises a hole, and wherein the microwave application structure and the solid-state spin sensor are disposed such that they cover at least a part of the hole.

7. The solid-state spin sensor system of claim 6, wherein the microwave application structure has a thickness of 10 nanometers to 20 micrometers.

8. The solid-state spin sensor system of claim 1, wherein the mounting structure and the microwave application structure are on opposing sides of the solid-state spin sensor.

9. The solid-state spin sensor system of claim 1, further comprising a glass coupling element for delivery of light to the solid-state spin sensor.

10. The solid-state spin sensor system of claim 9, further comprising:
    immersion oil contacting an emission face of the solid-state spin sensor; and
    an imaging element contacting the immersion oil opposite the emission face of the solid-state spin sensor,
    wherein the imaging element is configured to collect light emitted by the color center defects in the solid-state spin sensor.

11. The solid-state spin sensor system of claim 1, wherein the microwave application structure or portions thereof are reflective to decrease the quantity of light exits one side of the solid-state spin sensor and increases the quantity of light which exits another side of the solid-state spins sensor.

12. The solid-state spin sensor system of claim 1, wherein the mounting structure is secured to the solid-state sensor using a high thermal conductive bond.

13. The solid-state spin sensor system of claim 1, further comprising a spatially resolved imaging device configured to capture at least one image of light emitted by the solid-state spin sensor, wherein the image provides spatially resolved information about a physical quantity.

14. The solid-state spin sensor system of claim 13, wherein the solid-state spin sensor comprises color center defects located in a layer on one surface of the solid-state spin sensor.

15. The solid-state spin sensor system of claim 1, wherein the solid-state spin sensor system is configured for use as a bulk detector.

16. The solid-state spin sensor system of claim 1, wherein the solid-state spin sensor comprises color center defects located throughout approximately the entire thickness of the spin sensor.

17. The solid-state spin sensor system of claim 1, wherein the mounting structure comprises at least one of diamond, semi-insulating silicon carbide, zinc oxide, silicon, gallium nitride, magnesium oxide, magnesium fluoride, and sapphire.

18. A method of manufacturing a solid-state spin sensor system comprising:
    providing a solid-state spin sensor having a plurality of color center defects;
    providing a mounting structure in thermal contact with the solid-state spin sensor; and
    disposing a microwave application structure on a face of the mounting structure or a face of the solid-state spin sensor for applying microwave radiation to the solid-state spin sensor.

19. The method of claim 18, wherein said disposing the microwave application structure on a face of the mounting structure or a face of the solid-state spin sensor comprises printing the microwave application structure on the face of the mounting structure or the face of the solid-state spin sensor.

20. The solid-state spin sensor system of claim 18, wherein the microwave application structure is disposed on a face of the mounting structure that is proximal to the solid-state spin sensor.

* * * * *

UNITED STATES PATENT AND TRADEMARK OFFICE
CERTIFICATE OF CORRECTION

| | | |
|---|---|---|
| PATENT NO. | : 10,928,320 B2 | |
| APPLICATION NO. | : 16/008789 | |
| DATED | : February 23, 2021 | |
| INVENTOR(S) | : John Francis Barry et al. | |

It is certified that error appears in the above-identified patent and that said Letters Patent is hereby corrected as shown below:

In the Specification

At Column 1, Line numbers 14-20, please amend the paragraph entitled "Statement of Government Interest" as follows:
This invention was made with government support under 1122374 awarded by National Science Foundation (NSF) and under W911NF-15-1-0548 awarded by U.S. Army Research Office (ARO) and under HR0011-11-C-0073 awarded by U.S. Office of Naval Research (NAVY/ONR). The government has certain rights in this invention.

Signed and Sealed this
Twenty-fifth Day of October, 2022

Katherine Kelly Vidal
*Director of the United States Patent and Trademark Office*